United States Patent
Lim et al.

(10) Patent No.: US 12,513,873 B2
(45) Date of Patent: Dec. 30, 2025

(54) DISPLAY DEVICE

(71) Applicant: Samsung Display Co., LTD., Yongin-si (KR)

(72) Inventors: Hee Sung Lim, Yongin-si (KR); Sung Yong Kwon, Yongin-si (KR); In Chan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

(21) Appl. No.: 18/396,033

(22) Filed: Dec. 26, 2023

(65) Prior Publication Data
US 2024/0306353 A1  Sep. 12, 2024

(30) Foreign Application Priority Data
Mar. 9, 2023 (KR) .................. 10-2023-0031189

(51) Int. Cl.
*H05K 7/20* (2006.01)
*H05K 5/03* (2006.01)

(52) U.S. Cl.
CPC .......... *H05K 7/20963* (2013.01); *H05K 5/03* (2013.01)

(58) Field of Classification Search
CPC .............................. H05K 7/20963; H05K 5/03
See application file for complete search history.

(56) References Cited

U.S. PATENT DOCUMENTS

| | | | |
|---|---|---|---|
| 2021/0175462 A1* | 6/2021 | Shin | H10K 59/8794 |
| 2022/0181576 A1* | 6/2022 | Cha | H10K 77/111 |
| 2022/0310964 A1* | 9/2022 | Xia | H05K 7/20954 |
| 2022/0310970 A1* | 9/2022 | Choi | H10K 59/131 |
| 2023/0199990 A1* | 6/2023 | Shin | G06F 1/203 |
| | | | 361/807 |

FOREIGN PATENT DOCUMENTS

| | | |
|---|---|---|
| KR | 10-2022-0019500 | 2/2022 |
| KR | 10-2386505 | 4/2022 |
| KR | 10-2022-0092213 | 7/2022 |
| KR | 10-2022-0095665 | 7/2022 |

* cited by examiner

*Primary Examiner* — Mukundbhai G Patel
(74) *Attorney, Agent, or Firm* — Sughrue Mion, PLLC

(57) ABSTRACT

A display device includes a first area, a bending area, and a second area disposed between the first area and the bending area, a display panel disposed in the first area, the bending area, and the second area, and a cover panel layer disposed on a surface of the display panel. The cover panel layer includes a light-blocking layer disposed on the surface of the display panel in the first area and the second area, a cushion layer disposed on the light-blocking layer in the first area and the second area, a heat sink layer disposed on the cushion layer in the first area and the second area, and a release film layer disposed between the cushion layer and the heat sink layer in the first area but not in the second area.

20 Claims, 16 Drawing Sheets

DISPLAY DEVICE

CROSS REFERENCE TO RELATED APPLICATION(S)

This application claims priority to and benefits of Korean Application No. 10-2023-0031189 under 35 U.S.C. § 119, filed on Mar. 9, 2023, in the Korean Intellectual Property Office (KIPO), the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices, liquid-crystal display (LCD) devices, and the like are currently used.

Display devices include a display panel such as an organic light-emitting display panel, a liquid-crystal display panel, and the like for displaying images. Among the display panels, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

A display device includes a panel bottom member disposed under a display panel. The panel bottom member may include a variety of functional sheets and protect the display panel from heat, external impact, or the like.

SUMMARY

The disclosure provides a display device that reduces a radius of curvature in case that the display device is bent by reducing a thickness of a panel bottom member.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a display device may include a first area, a bending area, and a second area disposed between the first area and the bending area, a display panel disposed in the first area, the bending area, and the second area, and a cover panel layer disposed on a surface of the display panel. The cover panel layer may include a light-blocking layer disposed on the surface of the display panel in the first area and the second area, a cushion layer disposed on the light-blocking layer in the first area and the second area, a heat sink layer located on the cushion layer and disposed in the first area and the second area, and a release film layer disposed between the cushion layer and the heat sink layer in the first area but not in the second area.

A side of the release film layer may face the heat sink layer disposed in the second area.

The heat sink layer disposed in the second area and the release film layer may be disposed on a same layer.

The release film layer may include polyimide.

The display device may further include a first adhesive layer disposed between the cushion layer and the heat sink layer in the first area and the second area. The first adhesive layer may include a first surface facing the cushion layer and a second surface opposite to the first surface. A portion of the second surface of the first adhesive layer disposed in the first area may contact the release film layer. Another portion of the second surface of the first adhesive layer disposed in the second area may contact the heat sink layer.

The display device may further include a second adhesive layer disposed between the heat sink layer and the release film layer in the first area. The second adhesive layer may not be disposed in the second area.

The display device may further include a third area disposed on a side of the bending area opposite to the second area, a pattern film layer overlapping the second area of the display panel in a plan view and disposed between the display panel and the heat sink layer in the third area, and a third adhesive layer disposed between the heat sink layer and the pattern film layer. The third adhesive layer and the pattern film layer may not overlap the release film layer in a direction perpendicular to the display panel.

A side surface of the heat sink layer disposed in the first area may be spaced apart from the pattern film layer in a first direction and face the pattern film layer.

A side surface of the heat sink layer disposed in the first area may be spaced apart from the third adhesive layer in a first direction and face the third adhesive layer.

The display device may further include a driving circuit and a flexible printed circuit board disposed on the third area of the display panel. The driving circuit and the flexible printed circuit board may overlap the pattern film layer in a direction perpendicular to the display panel.

The release film layer may not overlap the driving circuit in a direction perpendicular to the display panel.

A space may be defined between a side surface of the release film layer and the heat sink layer disposed in the second area.

The space may be surrounded by the heat sink layer, the release film layer, and the first adhesive layer.

A thickness of the cover panel layer disposed in the second area may be less than a thickness of the cover panel layer disposed in the first area in a direction perpendicular to the display panel.

The display device may include a bending protection layer disposed on the display panel and in the bending area. The bending protection layer may overlap the pattern film layer in a direction perpendicular to the display panel.

According to an embodiment, a display device may include a first area, a bending area, and a second area disposed between the first area and the bending area, a display panel disposed in the first area, the bending area, and the second area, and a cover panel layer disposed on a surface of the display panel. The cover panel layer may include a light-blocking layer disposed on the surface of the display panel in the first area and the second area, a cushion layer disposed on the light-blocking layer in the first area and the second area, a first heat sink layer disposed on the cushion layer in the first area and the second area, a release film layer disposed between the cushion layer and the first heat sink layer in the first area but not in the second area, and a second heat sink layer disposed on the first heat sink layer in the second area but not in the first area.

A side of the release film layer may face the first heat sink layer disposed in the second area, and a side of the first heat sink layer disposed in the first area may face the second heat sink layer disposed in the second area.

The display device may further include a first adhesive layer disposed between the first heat sink layer and the second heat sink layer in the second area. A side of the first heat sink layer disposed in the first area may face the first adhesive layer.

A thickness of the second heat sink layer may be less than a thickness of the release film layer in a direction perpendicular to the display panel.

A thickness of the cover panel layer disposed in the second area may be less than a thickness of the cover panel layer disposed in the first area in the direction perpendicular to the display panel.

According to an embodiment, it is possible to reduce the thickness of a panel bottom member of a display device.

According to an embodiment, it is possible to reduce the thickness of a panel bottom member of a display device, and to reduce the radius of curvature in case that the display device is bent.

According to an embodiment, it is possible to reduce the thickness of a panel bottom member of a display device, and to reduce a bezel area.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
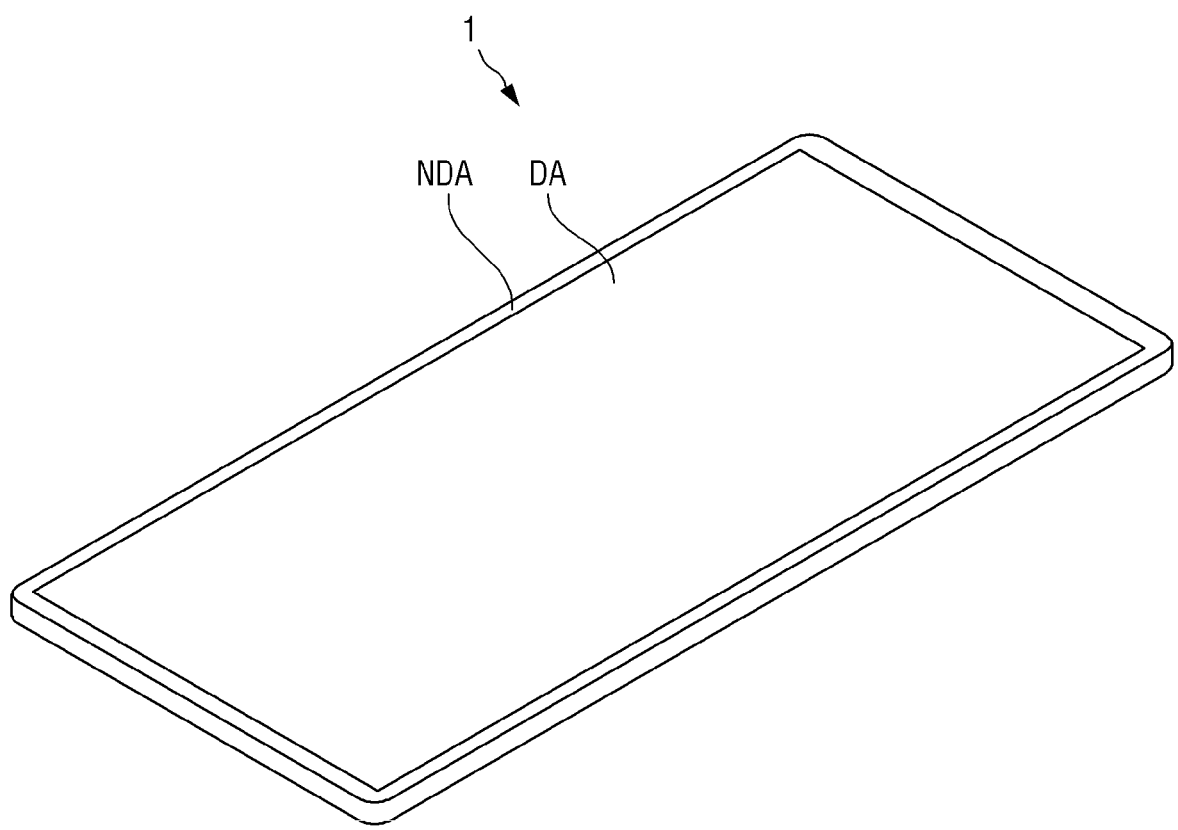
FIG. 1 is a schematic perspective view of a display device in accordance with an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be more thorough and complete, and will fully convey the scope of the disclosure to those skilled in the art. The terminology used herein is for the purpose of describing particular embodiments and is not intended to be limiting.

For example, in the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that when an element (or a region, a layer, a portion, or the like) is referred to as "being on," "connected to" or "coupled to" another element in the specification, it can be directly disposed on, connected or coupled to another element mentioned above, or intervening elements may be disposed therebetween. It may also be understood that if one part and another part are connected, they may or may not be integral with each other. Also, when an element is referred to as being "in contact" or "contacted" or the like to another element, the element may be in "electrical contact" or in "physical contact" with another element; or in "indirect contact" or in "direct contact" with another element.

It will be understood that the terms "connected to" or "coupled to" may include a physical or electrical connection or coupling.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About," "approximately," or other similar terms as used herein is used as terms of approximation and not as terms of degree, and is inclusive of the stated value and means within an acceptable range of deviation for the particular value as determined by one of ordinary skill in the art, considering the measurement in question and the error associated with measurement of the particular quantity (i.e., the limitations of the measurement system). As such, are utilized to account for inherent deviations in measured, calculated, and/or provided values that would be recognized by one of ordinary skill in the art. For example, "about" may mean within one or more standard deviations, or within ±30%, 20%, 10%, 5% of the stated value.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Spatially relative terms, such as "below," "under," "lower," "upper," "side," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The first direction X, the second direction Y, and the third direction Z are not limited to three axes of a rectangular coordinate system, such as the x, y, and z axes, and may be interpreted in a broader sense. For example, the first direction X, the second direction Y, and the third direction Z may be perpendicular to one another, or may represent different directions that are not perpendicular to one another.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. When an embodiment may be implemented differently, a specific process order may be performed differently from the described order. For example, two consecutively described processes may be performed substantially at the same time or performed in an order opposite to the described order.

Various embodiments are described herein with reference to sectional and/or exploded illustrations that are schematic illustrations of embodiments and/or intermediate structures.

As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction X and a second direction Y. A normal direction of the display surface, i.e., a thickness direction of the display device 1, may indicate a third direction Z. In this specification, an expression of "when viewed from the top or in a plan view" may represent a case when viewed in the third direction Z. Hereinafter, a front surface (or a top surface) and a rear surface (or a bottom surface) of each of layers or units may be distinguished by the third direction Z. However, directions indicated by the first to third directions X, Y, and Z may be a relative concept, and converted with respect to each other, e.g., converted into opposite directions.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the various embodiments may be partially or wholly combined, and each embodiment may be able to be performed independently with respect to each other or may be implemented together within the spirit and the scope of the disclosure.

Hereinafter, embodiments will be described with reference to the accompanying drawings.

Figure 2:
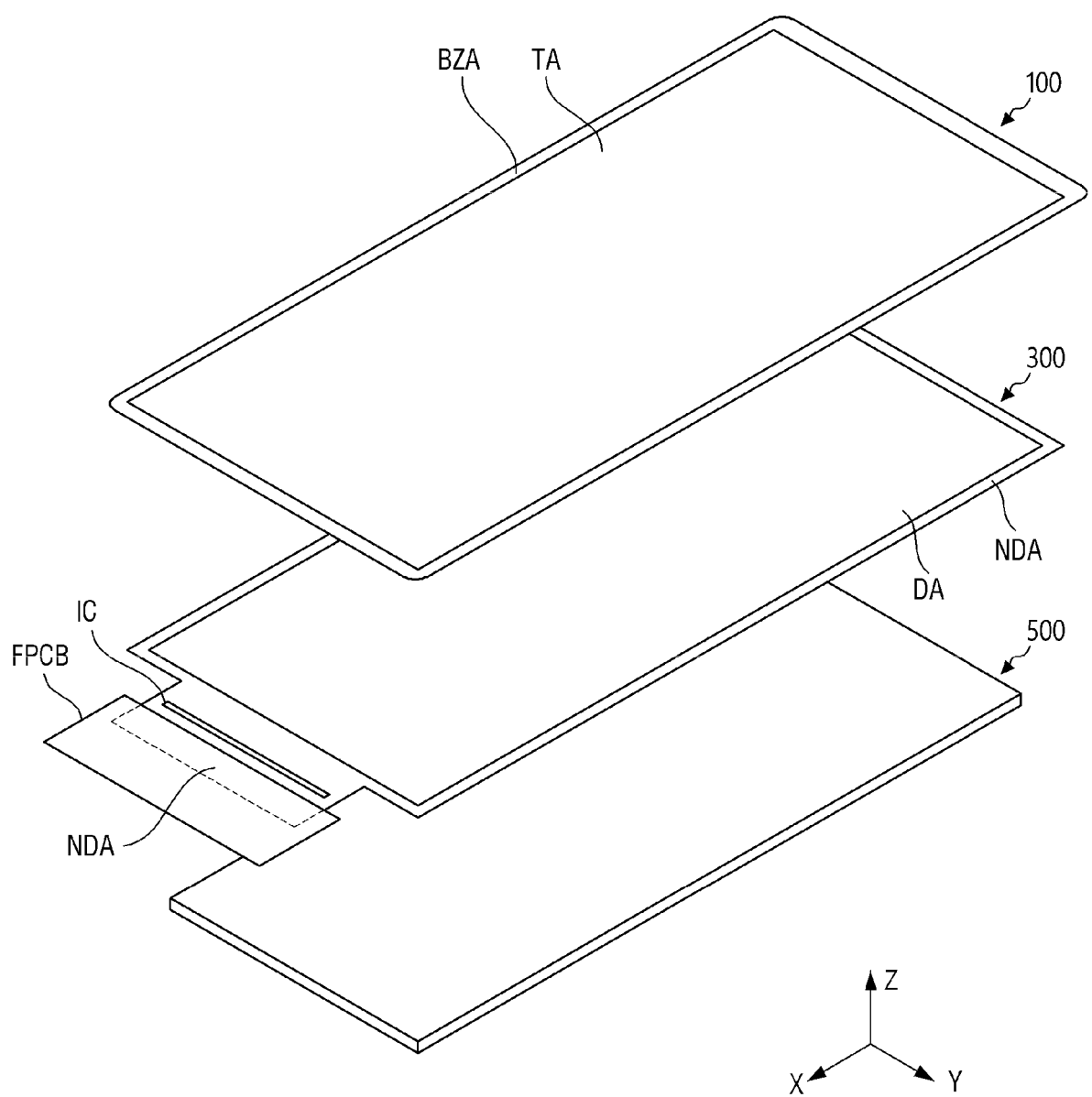
FIG. 2 is a schematic exploded perspective view of a display device in accordance with an embodiment.

FIG. 1 is a schematic perspective view of a display device 1 in accordance with an embodiment. FIG. 2 is a schematic exploded perspective view of a display device 1 in accordance with an embodiment.

Referring to FIG. 1, the display device 1 may display a moving image or a still image. The display device 1 may be an electronic device that provides a display screen. For example, the display device 1 may be a television set, a laptop computer, a monitor, an electronic billboard, Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, or the like.

In FIG. 1, a first direction X, a second direction Y, and a third direction Z are defined. The first direction X and the second direction Y may be perpendicular to each other. The first direction X and the third direction Z may be perpendicular to each other. The second direction Y and the third direction Z may be perpendicular to each other. The first direction X may be a vertical direction of the display device 1 in the drawings, the second direction Y may be a horizontal direction of the display device 1 in the drawings, and the third direction Z may be an up-and-down direction, i.e., a thickness direction of the display device 1 in the drawings.

As used herein, a direction may be the direction indicated by an arrow as well as an opposite direction, unless specifically stated otherwise. If it is necessary to distinguish between such two opposite directions, one of the two directions may be referred to as "in a direction," while another direction may be referred to as "an opposite direction." In FIG. 1, a direction indicated by an arrow may be referred to as a direction, while another direction may be referred to as an opposite direction.

In the following description of surfaces of the display device 1 or elements of the display device 1, the surfaces facing a direction where images are displayed, i.e., the third direction Z will be referred to as an upper surface, while opposite surfaces will be referred to as a lower surface for convenience of illustration. However, the disclosure is not limited thereto. The surfaces and the opposite surfaces of the elements may be referred to as a front surface and a rear surface, respectively, or may be referred to as a first surface and a second surface, respectively. In the description of relative positions of the elements of the display device 1, a direction in the third direction Z may be referred to as an upper direction while an opposite direction of the third direction Z may be referred to as a lower direction.

A shape of the display device 1 may be modified in a variety of ways. For example, the display device 1 may have shapes such as a rectangle with longer lateral sides, a rectangle with longer vertical sides, a square, a quadrangle with rounded corners (vertices), other polygons, a circle, or the like in a plan view. A shape of a display area DA of the display device 1 may also be substantially identical or similar to the shape (e.g., an overall shape) of the display device 1. In an embodiment, referring to FIG. 1, the display device 1 may have a rectangular shape elongated in the first direction X, with longer sides in the first direction X and shorter sides in the second direction Y.

The display device 1 may include a display area DA that displays an image, and a non-display area NDA disposed adjacent to the display area DA. In the non-display area NDA, no image may be displayed. The display area DPA may be an active area, while the non-display area NDA may be an inactive area. The display area DA may generally occupy a center of the display device 1. In embodiments, the non-display area NDA may surround the display area DA in a plan view, but the disclosure is not limited thereto.

Referring to FIG. 2 in conjunction with FIG. 1, the display device 1 may include a display panel 300 and a cover panel layer 500 disposed under the display panel 300. The display device 1 may further include a window 100 disposed on the display panel 300.

The window 100 may include a transmissive area TA that transmits images provided by the display panel 300 and a bezel area BZA disposed adjacent to the transmissive area TA.

In the transmissive area TA, images may be displayed. A user may see images through the transmissive area TA. In an embodiment, the transmissive area TA may have a rectangular shape with rounded corners in a plan view. However, the disclosure is not limited thereto, and the transmissive area TA may have a variety of shapes.

The bezel area BZA may be disposed adjacent to the transmissive area TA and may surround the transmissive area TA. Accordingly, a shape of the transmissive area TA may be substantially defined by the bezel area BZA. However, the disclosure is not limited thereto. The bezel area BZA may be disposed adjacent to only a side of the transmissive area TA. In another embodiment, the bezel area BZA may be omitted.

The window 100 may be disposed on the display panel 300 and protect the display panel 300. The window 100 may overlap the display panel 300 in a plan view and cover a front surface of the display panel 300. The window 100 may be larger than the display panel 300 in a plan view.

The window 100 may be made of glass, sapphire, plastic, the like, or a combination thereof. In an embodiment, the window 100 may be rigid, but the disclosure is not limited thereto. In another embodiment, the window 100 may be flexible.

The display panel 300 may be disposed under the window 100. The display panel 300 and the window 100 may be coupled with each other by a transparent coupling layer (not shown) such as an optical clear adhesive (OCA), an optical clear resin (OCR), or the like.

The display panel 300 may include the display area DA and the non-display area NDA.

The display area DA may display images and overlap the transmissive area TA of the window 100 in a plan view. The non-display area NDA may not display images, be disposed adjacent to the display area DA, and overlap the bezel area BZA of the window 100 in a plan view.

In embodiments, the display panel 300 may include a self-luminous element (not shown). In an embodiment, the self-luminous element may include at least one of an organic light-emitting diode, a quantum dot light-emitting diode, and a micro light-emitting diode based on inorganic material (e.g., Micro LED). In the following description, an embodiment that the self-luminous element is an organic light-emitting element is described for convenience of illustration. A detailed description of each of elements of a display module 30 will be described below with reference to FIGS. 4 and 5.

The cover panel layer 500 may be disposed under the display panel 300. A pattern film layer (see, e.g., 400 of FIG. 4) that attaches the display panel 300 to the cover panel layer 500 may be disposed between the display panel 300 and the cover panel layer 500. The cover panel layer 500 may be attached to the display panel 300 by the pattern film layer 400 through a process of attaching with a roller.

The cover panel layer 500 may protect the display panel 300 against heat, block electromagnetic waves, block or absorb light, absorb shock, and/or the like. The cover panel layer 500 may include a functional layer (not shown) having at least one of the functions such as blocking electromagnetic waves, blocking or absorbing light, absorbing shock, and/or the like. A structure of the cover panel layer 500 will be described in detail below with reference to FIG. 6.

Hereinafter, a structure of the display panel 300 and the cover panel layer 500 of the display device 1 according to an embodiment will be described in detail.

Figure 3:
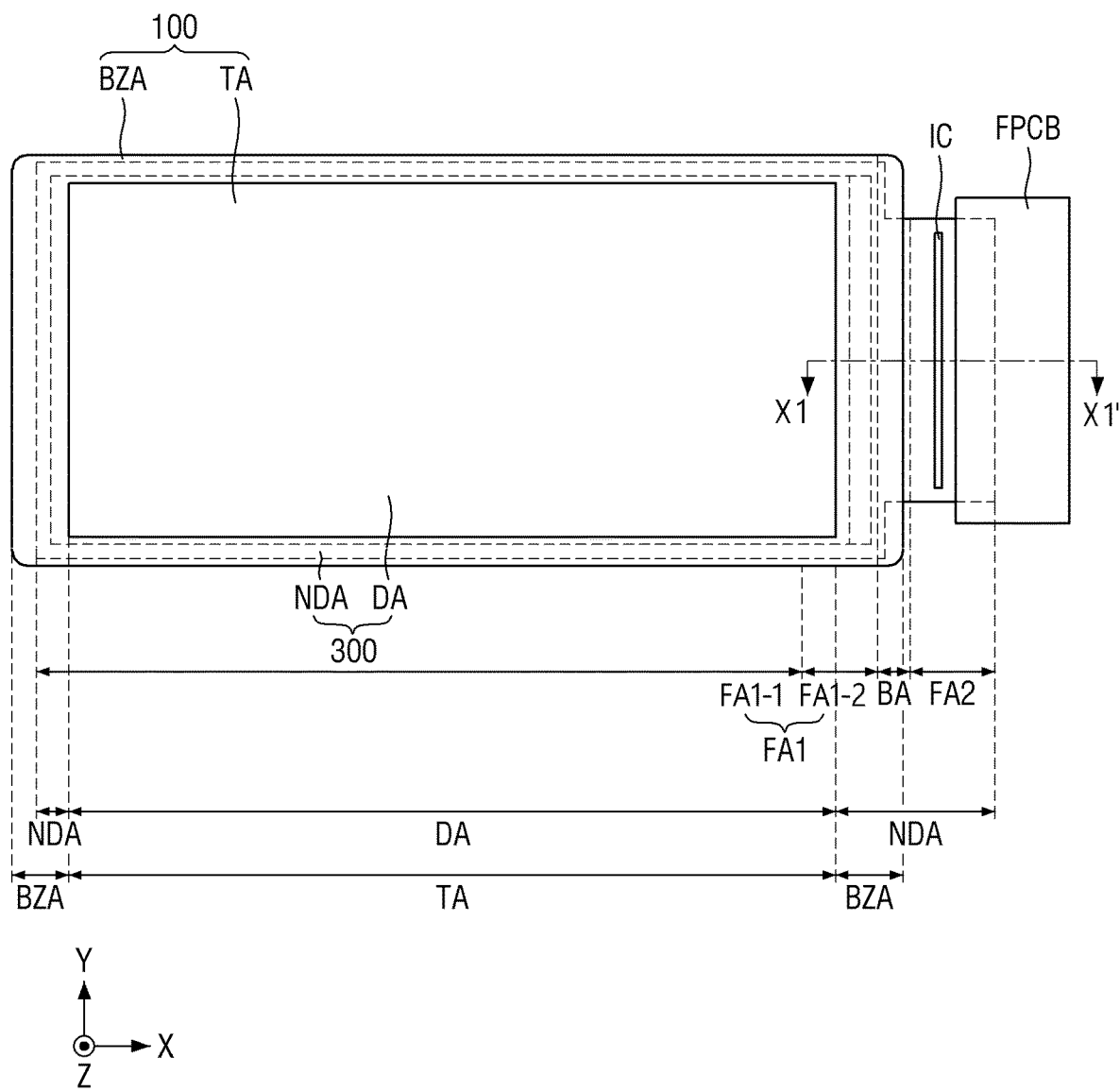
FIG. 3 is a schematic plan view of a display device in accordance with an embodiment.

FIG. 3 is a schematic plan view of a display device 1 in accordance with an embodiment in a state not bent.

As described above, the transmissive area TA of the window 100 and the display area DA of the display panel 300 may define the display area DA of the display device 1. The bezel area BZA of the window 100 and the non-display area NDA of the display panel 300 may define the non-display area NDA of the display device 1.

FIGS. 1 to 3 illustrate that the display area DA has a rectangular shape according to an embodiment. However, the disclosure is not limited thereto. The display area DA may have a variety of shapes.

In embodiments, the display panel 300 may include a flexible substrate (not shown) including a flexible polymer material such as polyimide or the like. Accordingly, the display panel 300 may be curved, bent, folded, or rolled.

The display panel 300 may include (or be divided into) a main area FA1, a bending area BA, and a subsidiary area (also referred to as a third area) FA2.

In the main area FA1, the display panel 300 may not be bent and may include (or be divided into) the display area DA and a portion of the non-display area NDA. In embodiments, the main area FA1 may have a substantially flat shape. In the following description, the main area FA1 may be referred to as a first flat area.

Figure 7:
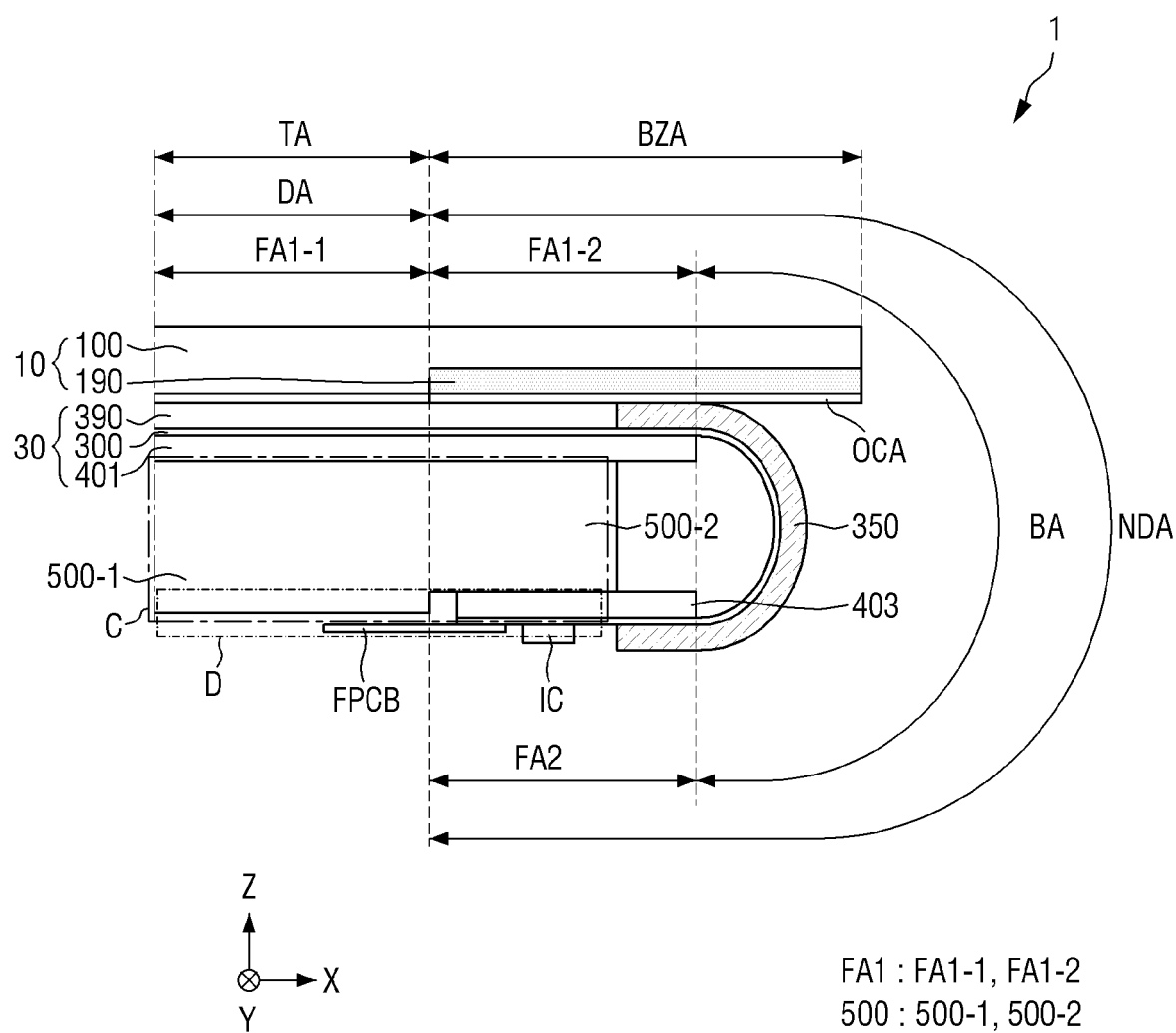
FIG. 7 is a schematic enlarged cross-sectional view of the display device in a state bent in accordance with an embodiment.

The first flat area FA1 may be further divided into a first area FA1-1 and a second area FA1-2. A portion of the first flat area FA1 that overlaps the subsidiary area FA2 in the third direction Z in case that the display device 1 is bent may be defined as the second area FA1-2. This will be described in more detail with reference to FIGS. 5 and 7 illustrating the display device 1 in case that the display device 1 is bent.

Figure 5:
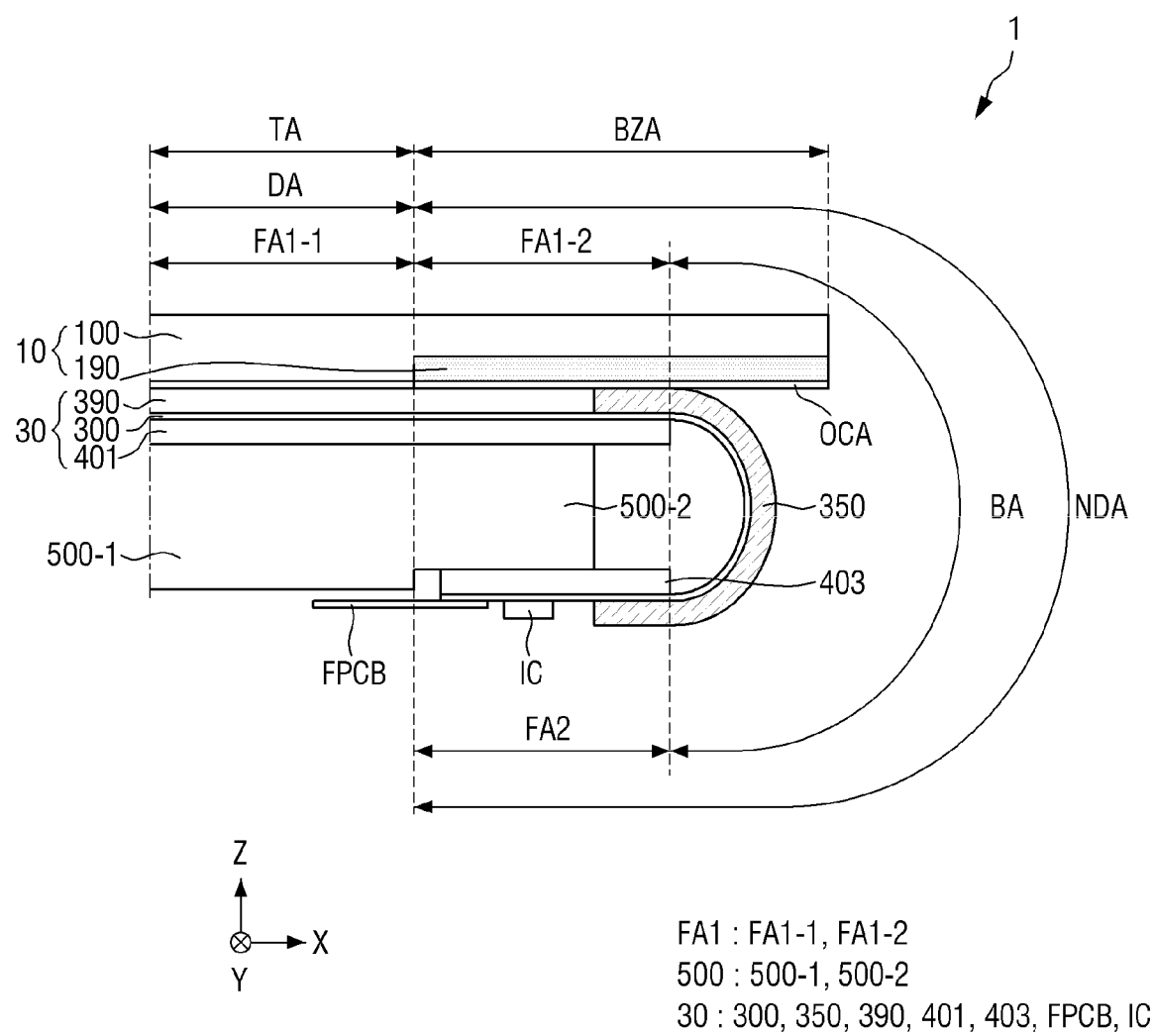
FIG. 5 is a schematic cross-sectional view of the display device in accordance with an embodiment in case that the display device of FIG. 3 is bent.

Referring to FIG. 5, the bending area BA may be an area that is located under the display panel 300 in case that the display panel 300 is bent. In embodiments, the bending area BA may extend from the first flat area FA1 and may be continuous with the first flat area FA1. In embodiments, the entire bending area BA may be included in the non-display area NDA.

The subsidiary area FA2 may be located on a side of the bending area opposite to the main area FA1 with the bending area BA interposed between the opposite side of the main area FA1 and the subsidiary area FA2. In embodiments, the subsidiary area FA2 may extend from the bending area BA and may be continuous with the bending area BA. In embodiments, the entire subsidiary area FA2 may be included in the non-display area NDA. In the following description, the subsidiary area FA2 may be referred to as a second flat area.

Referring to FIG. 3, a driving circuit IC may be mounted on the display panel 300. In embodiments, the driving circuit IC may be located on the second flat area FA2 of the display panel 300.

The driving circuit IC may include driving elements (not shown) that drive pixels of the display panel 300. For example, the driving circuit IC may include at least one of a scan driving circuit that generates scan signals and transmits the scan signals to scan lines, a data driving circuit that transfers data signals to data lines, and an emission control driving circuit that transfers emission control signals to emission control lines.

Referring to FIG. 3, the driving circuit IC may be disposed on an upper surface of the display panel 300. Although the driving circuit IC is disposed on the display panel 300 according to an embodiment, but the disclosure is not limited thereto. In another embodiment, the driving circuit IC may be disposed on a flexible printed circuit board FPCB.

In embodiments, the flexible printed circuit board FPCB may be connected to the display panel 300. In embodiments, the flexible printed circuit board FPCB may be disposed on the display panel 300 in the second flat area FA2.

Referring to FIGS. 2 and 3, the flexible printed circuit board FPCB may be disposed on the upper surface of the display panel 300. The flexible printed circuit board FPCB may be electrically connected to the driving circuit IC. In embodiments, a pad part (not shown) that connects to the flexible printed circuit board FPCB may be formed on the display panel 300 in the second flat area FA2, and the flexible printed circuit board FPCB may be connected to the pad part.

In case that the display panel 300 is bent, the driving circuit IC and the flexible printed circuit board FPCB may face a lower surface of the display panel 300, for example, a surface on which no image is displayed.

Figure 4:
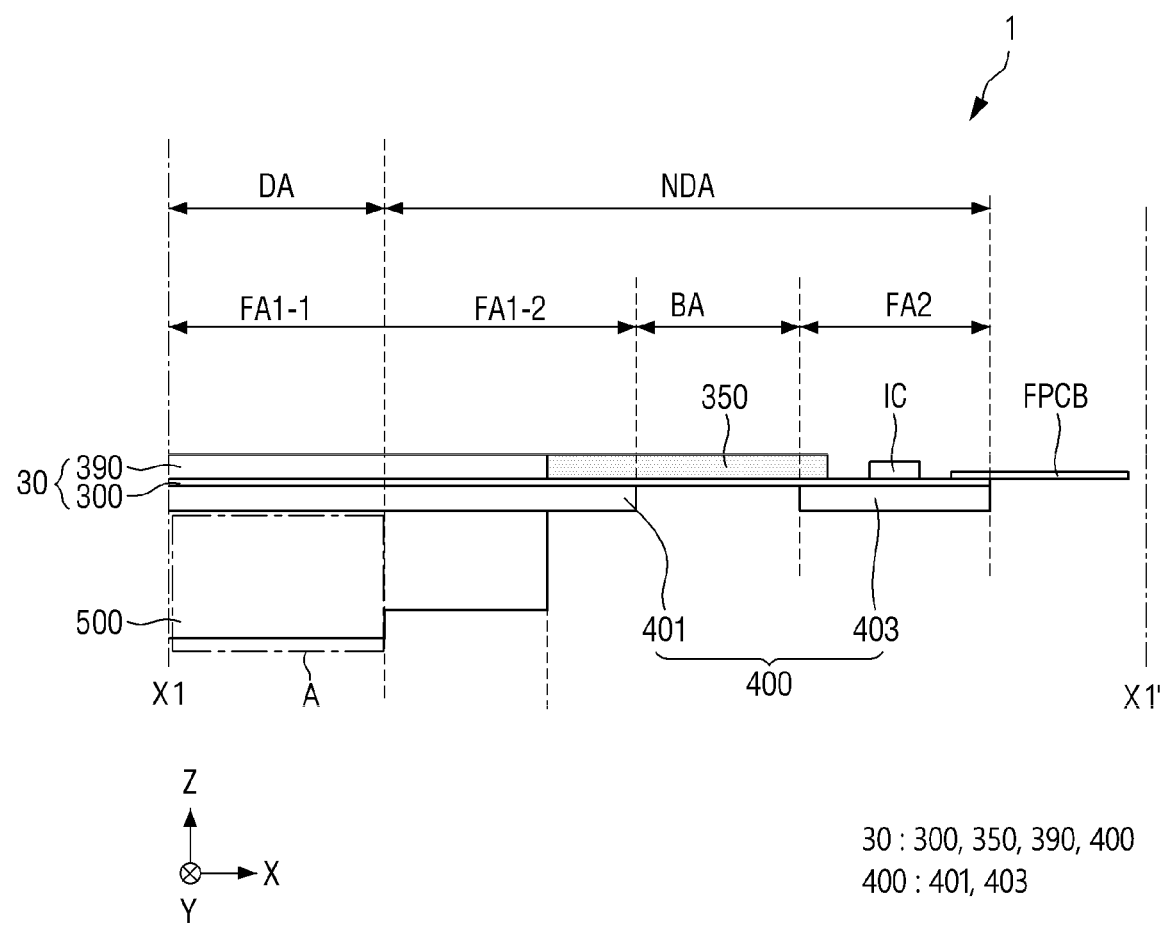
FIG. 4 is a schematic cross-sectional view of the display device in accordance with an embodiment, taken along line X1-X1' of FIG. 3.

FIG. 4 is a schematic cross-sectional view illustrating an arrangement of the display panel 300 and the cover panel layer 500 of the display device 1 in accordance with an embodiment, taken along line X1-X1' of FIG. 3. FIG. 4 is a schematic cross-sectional view of the display panel 300 and the cover panel layer 500 in case that the display device 1 in accordance with an embodiment is not bent. FIG. 5 is a schematic cross-sectional view of the display panel 300, the cover panel layer 500, and an upper module 10 in case that the display device 1 in accordance with an embodiment is bent, taken along line X1-X1' of FIG. 3.

Referring to FIGS. 4 and 5, the display device 1 may include the display module 30, the cover panel layer 500, and the upper module 10. In FIG. 4, the upper module 10 is omitted for convenience of illustration.

The display module 30 may include the display panel 300, an optical film 390 disposed on the display panel 300, and a pattern film layer 400 disposed under the display panel 300. The display module 30 may also include a bending protection layer 350 located on the display panel 300 in the bending area BA. For example, the bending protection layer 350 may be located in a portion of the second area FA1-2, the bending area BA, and a portion of the subsidiary area FA2. The display module 30 may further include the driving circuit IC and the flexible printed circuit board FPCB.

The display panel 300 may display images according to electric signals. For example, the display panel 300 may be a panel that displays images by receiving data signals, and may be one of an organic light-emitting display panel, a liquid-crystal display panel, a plasma display panel, an electrophoretic display panel, an electrowetting display panel, a quantum-dot emission display panel, and a micro LED. In the description, an organic light-emitting display panel is employed as the display panel 300.

The display panel 300 may be a light-emitting display panel. For example, the display panel 300 may be an organic light-emitting display panel, a quantum-dot light-emitting display panel, or the like. An emissive layer (not shown) of the organic light-emitting display panel may include an organic light-emitting material or the like. An emissive layer (not shown) of the quantum-dot light-emitting display panel may include quantum dots, quantum rods, the like, or a combination thereof. In the following description, an organic light-emitting display panel will be described as the display panel 300.

The optical film 390 may be disposed on the upper surface of the display panel 300. The optical film 390 may include a polarizing film, a micro lens, a prism film, or the like, but the disclosure is not limited thereto.

The optical film 390 may be attached on the upper surface of the display panel 300. In an embodiment, the optical film 390 and the display panel 300 may be attached by an adhesive material (not shown). The adhesive material may include an optically clear coupling layer, a transparent resin, or the like. For example, the adhesive material may include an optically clear pressure sensitive adhesive (e.g., transparent coupling layer, pressure sensitive adhesive (PSA)).

The pattern film layer 400 may be disposed on the lower surface of the display panel 300. The pattern film layer 400 may support a portion of the display panel 300 in the non-display area NDA other than the bending area, for example, the first flat area FA1 and the second flat area FA2.

Referring to FIG. 4, the pattern film layer 400 may include a first pattern film layer 401 and a second pattern film layer 403 spaced apart from each other in the first direction X. The pattern film layer 400 may be disposed in at least a partial area of the flat area FA.

In embodiments, in case that the display panel 300 is not bent, the first pattern film layer 401 may be located under the display panel 300 in the first flat area FA1, and the second pattern film layer 403 may be located under the display panel 300 in the second flat area FA2.

In embodiments, each of the first pattern film layer 401 and the second pattern film layer 403 may be attached to the lower surface of the display panel 300.

In embodiments, the pattern film layer 400 may not be located under the display panel 300 in the bending area BA. For example, referring to FIG. 4, in case that the display panel 300 is not bent, the first pattern film layer 401 and the second pattern film layer 403 may be spaced apart from each other with the bending area BA between the second flat area FA2 and the second area FA1-2 in the first direction X.

In an embodiment, the pattern film layer 400 may include, for example, polyethylene terephthalate (PET), polyimide (PI), polycarbonate (PC), polyethylene (PE), polypropylene (PP), polysulfone (PSF), polymethylmethacrylate (PMMA), triacetyl cellulose (TAC), cycloolefin polymer (COP), the like, or a combination thereof.

The bending protection layer 350 may be disposed on a portion of the display panel 300. In an embodiment, the bending protection layer 350 may be disposed on the display panel 300 in the bending area BA. In embodiments, the bending protection layer 350 may be further disposed on the display panel 300 in the first flat area FA1 or the second flat area FA2 as well as the bending area BA. In embodiments, the bending protection layer 350 may include a polymer compound such as polyimide, acrylate, epoxy, the like, or a combination thereof.

Referring to FIG. 5, the bending protection layer 350 may relieve stress applied to the display panel 300 in case that the display panel 300 is bent, and a durability of the display module 30 may be improved.

Referring to FIG. 5, the upper module 10 may be disposed on the display module 30. The upper module 10 may be disposed on the front surface of the display module 30, i.e., on a surface of the display module 30 in the third direction Z. In an embodiment, the upper module 10 may contact the front surface of the display module 30.

The upper module 10 may include a window 100 and a light-blocking pattern 190.

The window 100 may be disposed on the display module 30. The window 100 may protect the display module 30 from external shock and provide an input surface and/or a display surface to a user. The window 100 may include a transparent material that images can exit. For example, the window 100 may include glass, sapphire, plastic, or the like.

FIG. 5 illustrates that the window 100 has a single layer, but the disclosure is not limited thereto. In another embodiment, the window 100 may have a multi-layer structure. Such a multi-layer structure may be formed through a continuous process, a bonding process using an adhesive layer, or the like. In an embodiment, an entire portion or a portion of the window 100 may have flexibility.

The window 100 may include the light-blocking pattern 190 to avoid accessory elements (not shown) disposed in the non-display area NDA from being noticeable from an outside.

The light-blocking pattern 190 may be an organic film including a colored organic material. In embodiments, the light-blocking pattern 190 may be an organic film including a black organic material. In embodiments, the light-blocking pattern 190 may be formed on a rear surface of the window 100 by coating the light-blocking pattern 190.

In embodiments, the light-blocking pattern 190 may be disposed on a partial area of the window 100. For example, the light-blocking pattern 190 may be accommodated in a lower portion of the window 100. A lower surface of the light-blocking pattern 190 may coincide with the lower surface of the window 100.

The light-blocking pattern 190 may surround the window 100 (e.g., a periphery of the window 100). In an embodiment, the light-blocking pattern 190 may be substantially disposed in the bezel area BZA. Accordingly, in the non-display area NDA, for example, in the second area FA1-2, the display panel 300 may overlap (e.g., partially overlap) the light-blocking pattern 190 in the third direction Z, i.e., the thickness direction of the display device 1. However, the disclosure is not limited thereto. In the non-display area NDA, the display panel 300 may not overlap the light-blocking pattern 190 depending on an angle at which a user watches in the thickness direction of the display device 1.

The window 100 may be coupled with the display module 30 by an optically clear adhesive (OCA).

The cover panel layer 500 may be disposed under the display module 30. For example, the cover panel layer 500 may be disposed on a rear surface of the display module 30, i.e., on an opposite surface of the display module 30 in the third direction Z.

The cover panel layer 500 may be disposed on a lower surface of the first pattern film layer 401. The cover panel layer 500 may be attached to the display panel 300 or the pattern film layer 400 disposed under the display panel 300 by an upper coupling layer (see, e.g., 590 of FIG. 6) included in the cover panel layer 500.

The cover panel layer 500 may perform a heat dissipation function, an electromagnetic wave blocking function, a buffering function, a strength reinforcing function, and/or the like.

Referring to FIG. 5, the cover panel layer 500 may be disposed between the display module 30 in the third direction Z in case that the display panel 300 is bent. For example, in case that the display panel 300 is bent, in the second area FA1-2, a portion of the cover panel layer 500 overlapping the display module 30 may be located between the first pattern film layer 401 and the second pattern film layer 403 in the third direction Z.

Referring to FIG. 5, in the bending area BA, the display panel 300 may be bent with a curvature toward a lower side (or a lower surface), i.e., away from the display surface of the display panel 300. Although the bending area BA may have a constant radius of curvature, but the disclosure is not limited thereto. The bending area BA may have different radius of curvature in different regions. For example, in the bending area BA, the display panel 300 may have a semicircular shape, a semielliptical shape, or the like in a cross-sectional view.

FIG. 7 is a schematic cross-sectional view of the display device 1 in accordance with an embodiment in case that the display device 1 is bent.

Referring to FIGS. 5 and 7, in an embodiment, the first flat area FA1 may further include the first area FA1-1 and the second area FA-2.

The first area FA1-1 may overlap the display area DA and the transmissive area TA in the third direction Z, and the second area FA1-2 may overlap the second flat area FA2 in the third direction Z in case that the display panel 300 is bent. In an embodiment, the driving circuit IC and the flexible printed circuit board FPC may be disposed in the second flat area FA2. As described above, the driving circuit IC may be disposed on the display panel 300 in the second flat area FA2, and the flexible printed circuit board FPCB may be coupled to the display panel 300 in the second flat area FA2. Accordingly, in the second area FA1-2, the display panel 300 may overlap the driving circuit IC and the flexible printed circuit board FPCB in the third direction Z. In an embodiment, the second pattern film layer 403 may be disposed in the second area FA1-2. In the second area FA1-2, the display panel 300 may overlap the second pattern film layer 403 in the third direction Z.

The second cover panel layer 500-2 in the second area FA1-2 and the first cover panel layer 500-1 in the first area FA1-1 may include different cross-sectional structures.

Hereinafter, a structure and function of the cover panel layer 500 according to an embodiment will be described in detail with reference to FIG. 6.

Figure 6:
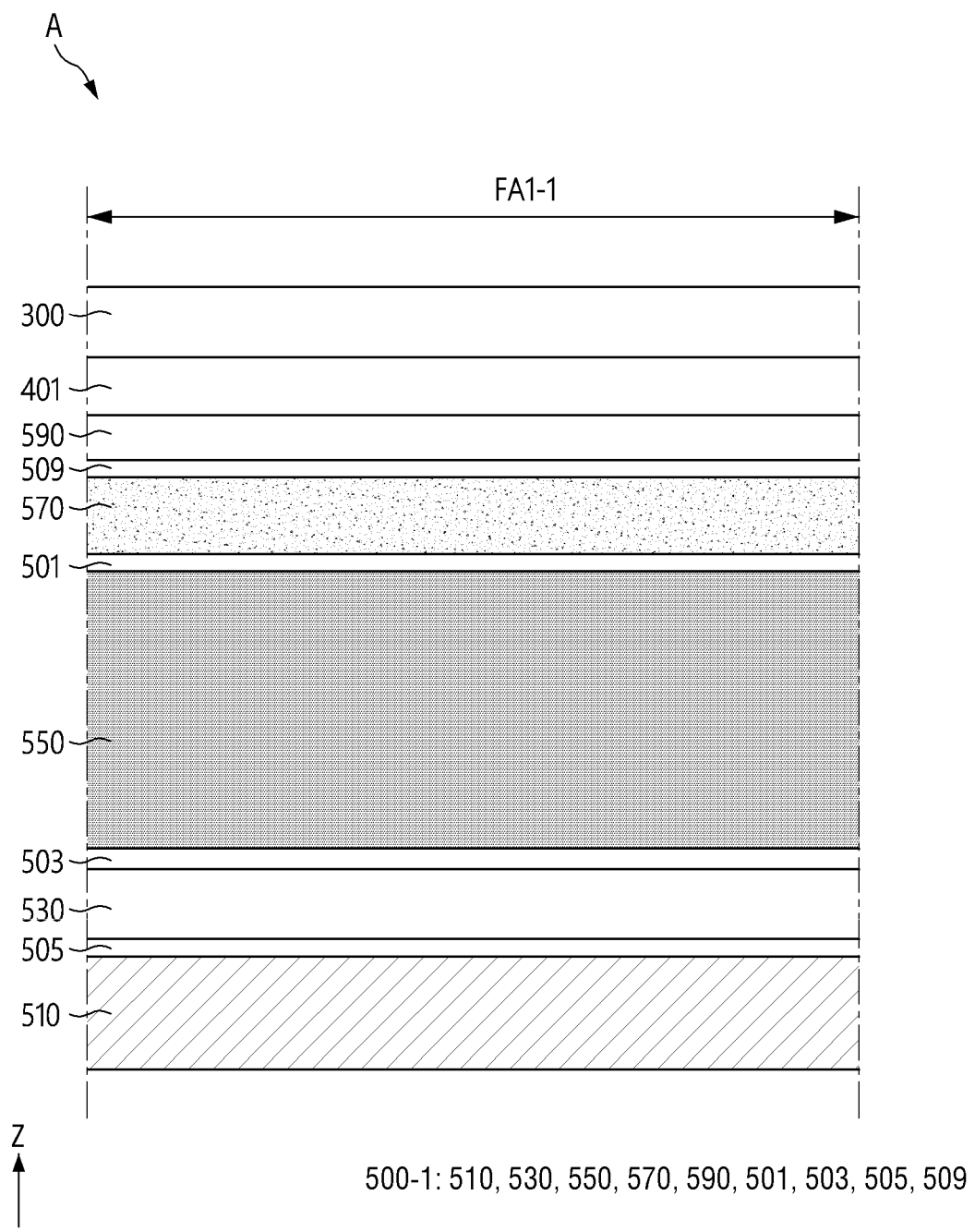
FIG. 6 is a schematic enlarged cross-sectional view of area A in FIG. 4.

FIG. 6 is a schematic enlarged cross-sectional view of part A of the cover panel layer 500 in a first area FA1-1 of FIG. 4.

The cover panel layer 500 may be disposed under the display module 30. The cover panel layer 500 may include at least one functional layer. The functional layer may perform a heat dissipation function, an electromagnetic wave blocking function, a buffer function, a strength reinforcing function, a support function, an adhesive function, the like, or a combination thereof. The functional layer may be a sheet layer made of a sheet, a film layer made of a film, a thin film layer, a coating layer, a panel, a plate, the like, or a combination thereof. The functional layer may be made up of a single layer or multiple thin films or coating layers stacked on one another. The functional layer may be, for example, a supporting substrate, a heat dissipation layer, an electromagnetic wave blocking layer, a shock absorbing layer, a coupling layer, the like, or a combination thereof.

For convenience of illustration, the cover panel layer 500 may include (or be divided into) a first cover panel layer 500-1 in the first area FA1-1 of the first flat area FA1, and a second cover panel layer 500-2 in the second area FA1-2. The first cover panel layer 500-1 and the second cover panel layer 500-2 may not independently formed but are separately described for convenience of illustration since the first cover panel layer 500-1 and the second cover panel layer 500-2 are disposed in different areas (e.g., the first area FA1-1 and the second area FA1-2).

In the following description, a portion of the cover panel layer 500 disposed in the first area FA-1 will be referred to as the first cover panel layer 500-1.

In embodiments, the first cover panel layer 500-1 may include a first heat sink layer 510, a release film layer 530, a cushion layer 550, a light-blocking layer 570, and an upper coupling layer 590.

The upper coupling layer 590 may be disposed between the first pattern film layer 401 and a base film 509.

The upper coupling layer 590 may be an upper layer of the first cover panel layer 500-1 and may contact the first pattern film layer 401. The upper coupling layer 590 of the first cover panel layer 500-1 may bond the display module 30 to the first cover panel layer 500-1. In embodiments, the upper coupling layer 590 may include an adhesive layer, a detachable layer, a resin layer, or the like.

An embossed pattern may be formed on an upper surface of the upper coupling layer 590, i.e., a surface contacting the display module 30. In case that the upper coupling layer 590 has the embossed pattern on the upper surface of the upper coupling layer 590, the embossed pattern may serve as an air passage in case that the first cover panel layer 500-1 is attached to the lower surface of the display module 30, thereby reducing bubbles. In case that the upper coupling layer 590 is completely attached to the lower surface of the display module 30, the embossed pattern of the upper coupling layer 590 may be collapsed and be flattened.

The base film 509 may be disposed between the upper coupling layer 590 and the light-blocking layer 570.

The base film 509 may be a support member supporting the first cover panel layer 500-1. The base film 509 may be a member that reinforces a strength of the display device 1 against external shock.

In embodiments, the base film 509 may include at least one of polyethylene terephthalate (PET), polyimide (PI), polycarbonate (PC), polyethylene (PE), polypropylene (PP), polysulfone (PSF), polymethylmethacrylate (PMMA), tri-acetylcellulose (TAC), and cycloolefin polymer (COP).

The light-blocking layer 570 may be disposed under the base film 509. The base film 509 may function as a support member and may also attach the light-blocking layer 570 to the upper coupling layer 590.

The light-blocking layer 570 may block a transmission of light and may prevent elements (e.g., the cushion layer 550) under the light-blocking layer 570 from being viewed from an outside of the display device 1. The light-blocking layer 570 may include a light-blocking material or the like or be a colored film having low light transmittance. For example, the light-blocking layer 570 may be a black plastic film, (e.g., a black polyethylene terephthalate (PET) film) or the like.

The cushion layer 550 may be disposed under the light-blocking layer 570.

The cushion layer 550 may absorb an external shock and may prevent the display device 1 from being damaged. The cushion layer 550 may be made up of a single layer or multiple layers stacked on one another. In embodiments, the cushion layer 550 may include a material allowing for elastic deformation. For example, the cushion layer 550 may include a thermoplastic elastomer, polystyrene, polyolefin, polyurethane thermoplastic elastomers, polyamides, synthetic rubbers, polydimethylsiloxane, polybutadiene, polyisobutylene, poly(styrene-butadienestyrene), polyurethanes, polychloroprene, polyethylene, silicone, the like, or a combination thereof. but the disclosure is not limited thereto. Any materials having elasticity may be employed as long as the material does not affect the image display by the display panel 300.

The cushion layer 550 and the light-blocking layer 570 may be attached by a first adhesive layer 501.

The first adhesive layer 501 may include an optically clear coupling layer, a transparent resin, or the like. For example, the first adhesive layer 501 may include an optically clear pressure sensitive adhesive (pressure sensitive adhesive (PSA)).

The release film layer 530 may be disposed under the cushion layer 550.

The release film layer 530 may include polyimide (PI) or the like. The release film layer 530 may be readily attached to and detached from the first heat sink layer 510 disposed under the release film layer 530. By the release film layer 530, the first heat sink layer 510 may be detached without changing a shape of the first heat sink layer 510.

The release film layer 530 and the cushion layer 550 may be attached by a second adhesive layer 503.

The second adhesive layer 503 may include an optically clear coupling layer, a transparent resin, or the like. For example, the second adhesive layer 503 may include an optically clear pressure sensitive adhesive (pressure sensitive adhesive (PSA)).

The first heat sink layer 510 may be disposed under the release film layer 530.

The first heat sink layer 510 may release a heat generated inside the display device 1 to an outside and may block electromagnetic waves. In embodiments, the first heat sink layer 510 may include a conductive metal such as copper, silver, gold, aluminum, nickel, or a combination thereof having excellent thermal conductivity. In an embodiment, the first heat sink layer 510 may include copper.

In an embodiment, the first heat sink layer 510 may further include graphite, carbon nanotubes, the like, or a combination thereof. The layer including graphite may be a graphitized polymer film, for example, a graphitized polyimide film.

The first heat sink layer 510 and the release film layer 530 may be attached by a third adhesive layer 505.

The third adhesive layer 505 may include an optically clear coupling layer, a transparent resin, or the like. For example, the third adhesive layer 505 may include an optically clear pressure sensitive adhesive (pressure sensitive adhesive (PSA)).

Figure 8:
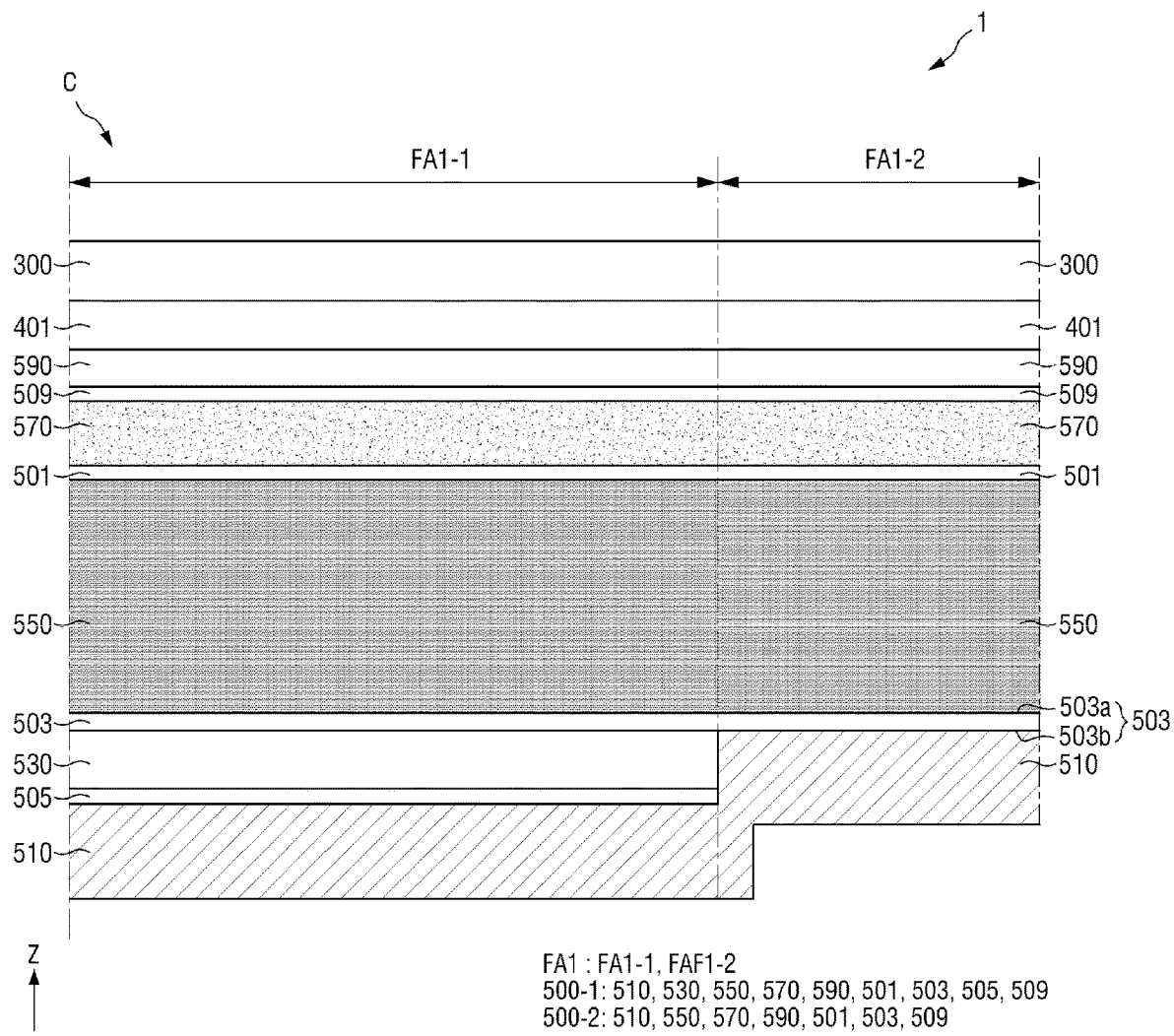
FIG. 8 is a schematic enlarged cross-sectional view of area C of first and second cover panel layers of FIG. 7 of a display device in accordance with an embodiment.

FIG. 8 is a schematic enlarged cross-sectional view of area C of the first and second cover panel layers 500-1 and 500-2 of FIG. 7 of a display device 1 in accordance with an embodiment.

Referring to FIG. 8, a second cover panel layer 500-2 disposed in the second area FA1-2 may be different in that the second cover panel layer 500-2 does not include the release film layer 530 included in the first cover panel layer 500-1 disposed in the first area FA1-1.

The detailed descriptions have already been given above, and description will focus on the difference.

In embodiments, the second cover panel layer 500-2 may include a first heat sink layer 510, a cushion layer 550, a light-blocking layer 570, and an upper coupling layer 590 in the second area FA1-2.

The upper coupling layer 590 may be disposed in the first area FA1-1 and the second area FA1-2. The upper coupling layer 590 may be an upper layer of the cover panel layer (see, e.g., 500 of FIGS. 4 and 5) and may contact the first pattern film layer 401. The upper coupling layer 590 of the cover panel layer 500 may bond the display module 30 to the cover panel layer 500.

The base film 509 may be disposed in the first area FA1-1 and the second area FA1-2 and may be disposed between the upper coupling layer 590 and the light-blocking layer 570.

The light-blocking layer 570 may be disposed in the first area FA1-1 and the second area FA1-2 and may be disposed under the base film 509.

The cushion layer 550 may be disposed in the first area FA1-1 and the second area FA1-2 and may be disposed under the light-blocking layer 570.

The cushion layer 550 and the light-blocking layer 570 may be disposed in the first area FA1-1 and the second area FA1-2 and may be attached by the first adhesive layer 501.

In embodiments, unlike the first cover panel layer 500-1 disposed in the first area FA1-1, in the second cover panel layer 500-2 disposed in the second area FA1-2, the first heat sink layer 510 may be disposed under the cushion layer 550.

For example, the second cover panel layer 500-2 may not include the release film layer 530, and a step may be formed in the second area FA1-2 which is equal to a thickness of the release film layer 530 in the first area FA1-1.

Unlike the first cover panel layer 500-1 disposed in the first area FA1-1, in the second area FA1-2, a second adhesive layer 503 may be disposed between the cushion layer 550 and the first heat sink layer 510 and may attach the cushion layer 550 and the first heat sink layer 510 together.

In embodiments, a surface where the second adhesive layer 503 and the cushion layer 550 contact may be defined as a first surface 503a, and the surface opposite to the first surface 503a may be defined as a second surface 503b.

For example, the second surface 503b of the second adhesive layer 503 may contact the release film layer 530 disposed in the first area FA1-1 and may contact the first heat sink layer 510 disposed in the second area FA1-2.

Figure 9:
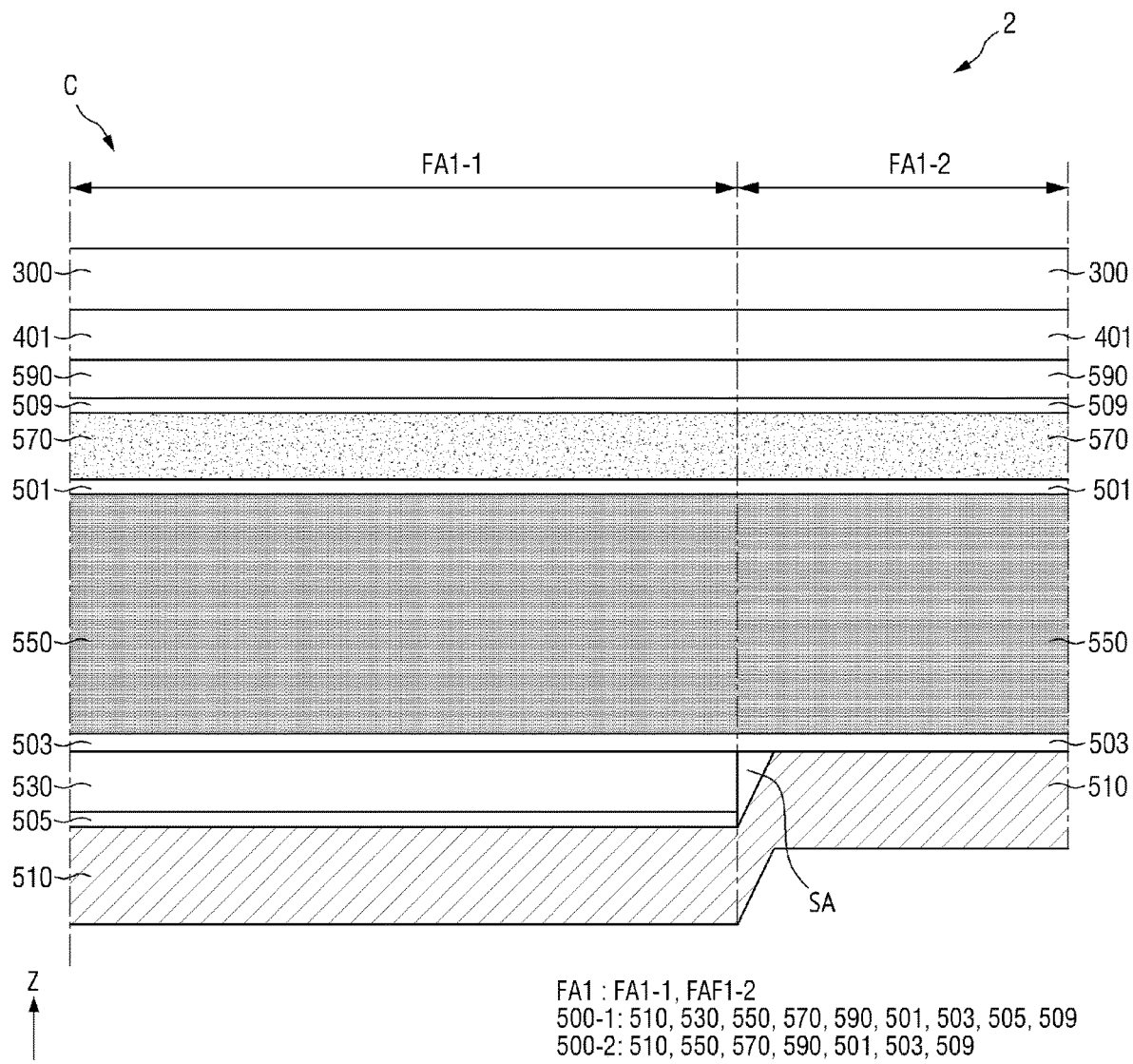
FIG. 9 is a schematic enlarged cross-sectional view of area C of first and second cover panel layers of FIG. 7 of a display device in accordance with another embodiment.

FIG. 9 is a schematic enlarged cross-sectional view of area C of the first and second cover panel layers 500-1 and 500-2 of FIG. 7 in a display device 2 in accordance with another embodiment.

The display device 2 of FIG. 9 and the display device 1 of FIGS. 1 to 8 may be different from each other in that a second cover panel layer 500-2 of the display device 2 includes a spaced area SA between a second adhesive layer 503 and a first heat sink layer 510 in the second area FA1-2.

The second cover panel layer 500-2 of the display device 2 may include a first heat sink layer 510, a cushion layer 550, a light-blocking layer 570, and an upper coupling layer 590 in the second area FA1-2.

The upper coupling layer 590 may be disposed in the first area FA1-1 and the second area FA1-2. The base film 509 may be disposed in the first area FA1-1 and the second area FA1-2 and may be disposed between the upper coupling layer 590 and the light-blocking layer 570. The light-blocking layer 570 may be disposed in the first area FA1-1 and the second area FA1-2 and may be disposed under the base film 509.

The cushion layer 550 may be disposed in the first area FA1-1 and the second area FA1-2 and may be disposed under the light-blocking layer 570. The cushion layer 550 and the light-blocking layer 570 may be disposed in the first area FA1-1 and the second area FA1-2 and may be attached together by the first adhesive layer 501.

In the second cover panel layer 500-2, the first heat sink layer 510 may be disposed under the cushion layer 550.

Hereinafter, the descriptions will focus on differences between the display device 1 and the display device 2 to avoid redundancy.

As described above, the second cover panel layer 500-2 may not include the release film layer 530, and there may be a step in the second area FA1-2, which is equal to a thickness of the release film layer 530 in the first area FA1-1. Accordingly, during a process of fabricating the first heat sink layer 510 in the first area FA1-1 and the second area FA1-2, there may be a spaced area SA at a side portion of the first heat sink layer 510 that meets the release film layer 530 in the second area FA1-2.

The first heat sink layer 510 may be attached to the third adhesive layer 505 disposed on the release film layer 530 in the first area FA1-1 and may be attached to the second adhesive layer 503 disposed on the cushion layer 550 in the second area FA1-2. The first heat sink layer 510 may include the spaced area SA at the side portion of the release film layer 530 in the second area FA1-2 while the first heat sink layer 510 is attached along the step.

Referring to FIG. 9, the spaced area SA may be surrounded by the release film layer 530 disposed in the first area FA1-1 and the first heat sink layer 510 and the second adhesive layer 503 disposed in the second area FA1-2.

Figure 10:
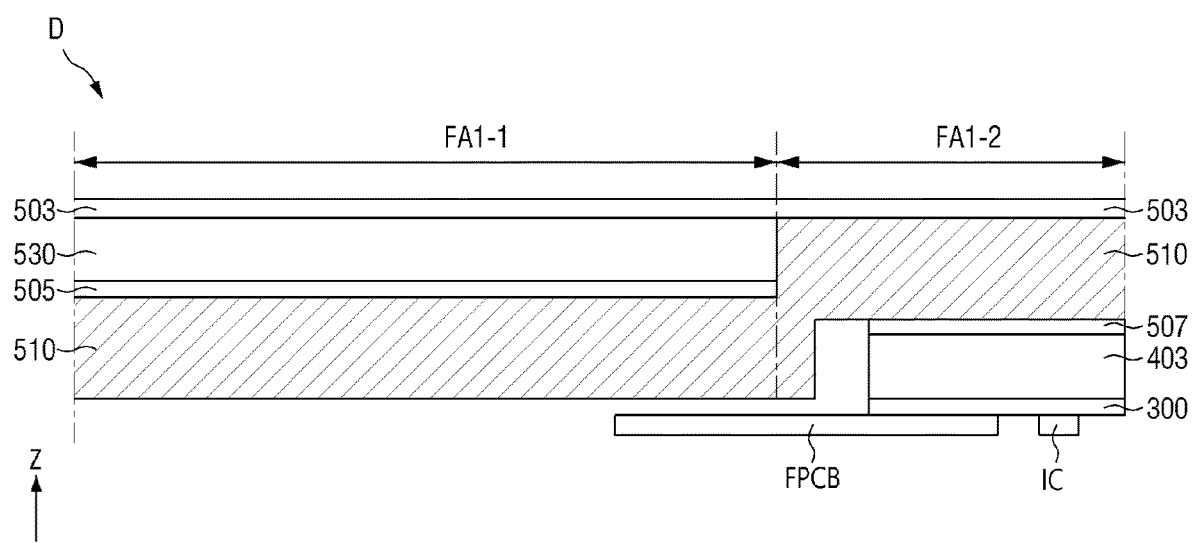
FIG. 10 is a schematic enlarged cross-sectional view of area D of FIG. 7.

FIG. 10 is a schematic enlarged cross-sectional view of area D of FIG. 7.

FIG. 10 illustrates the second pattern film layer 403, the fourth adhesive layer 507, the driving circuit IC, and the flexible printed circuit board FPCB in the second area FA1-2 in case that the display panel 300 is bent.

Referring to FIG. 4, the display panel 300 incase that the display device 1 is not bent may include the second pattern film layer 403 and disposed on a surface of the display panel 300, and may include the driving circuit IC and the flexible printed circuit board FPCB disposed on an opposite surface of the display panel 300 in the second flat area FA2.

Referring to FIG. 5, in case that the display panel 300 is bent, the second pattern film layer 403, the driving circuit IC, and the flexible printed circuit board FPCB which are disposed in the second flat area FA2 may overlap the second area FA1-2 of the first flat area FA1 in the third direction Z. In case that the display panel 300 is bent, the second flat area FA2 may overlap the second area FA1-2 of the first flat area FA1 in the third direction Z.

As described above with reference to FIG. 8, in the second area FA1-2, the second cover panel layer 500-2 may not include the release film layer 530. Therefore, a step may be formed in the second area FA1-2 which is equal to the thickness of the release film layer 530 in the first area FA1-1.

Therefore, referring to FIGS. 7 and 10, the display panel 300, the second pattern film layer 403, the driving circuit IC, and the flexible printed circuit board FPCB in the second flat area FA2 may contact the step in the second area FA1-2.

In embodiments, the fourth adhesive layer 507 may be disposed on a surface of the second pattern film layer 403. The first heat sink layer 510 disposed in the second area FA1-2 and the second pattern film layer 403 may be attached by the fourth adhesive layer 507.

The fourth adhesive layer 507 may include an optically clear coupling layer, a transparent resin, or the like. For example, the third adhesive layer 505 may include an optically clear pressure sensitive adhesive (pressure sensitive adhesive (PSA)).

Referring to FIG. 10, the side portion of the first heat sink layer 510 disposed in the first area FA1-1 may be spaced apart from the second pattern film layer 403, the fourth adhesive layer 507, the driving circuit IC, and the flexible printed circuit board FPCB in the first direction X and may face the second pattern film layer 403, the fourth adhesive layer 507, the driving circuit IC, and the flexible printed circuit board FPCB in the first direction X.

Figure 11:
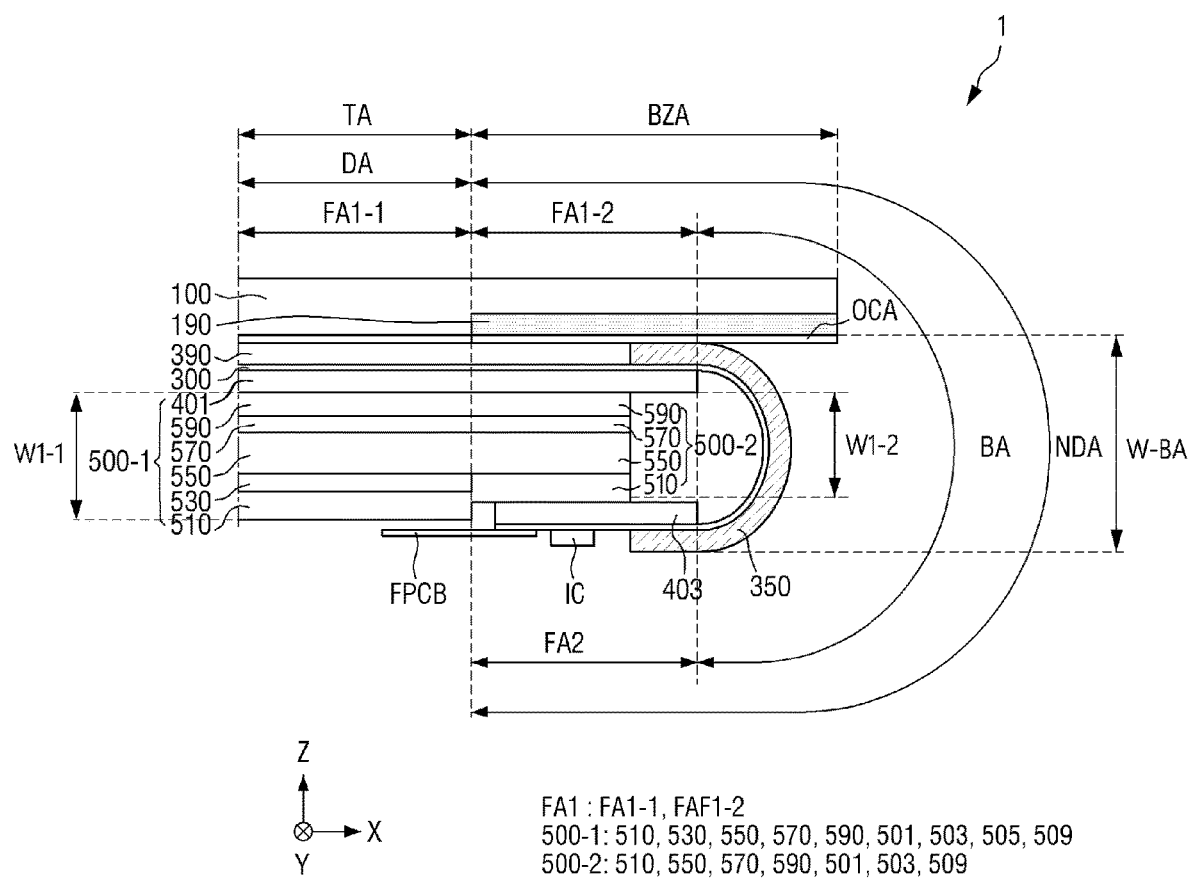
FIG. 11 is a schematic cross-sectional view illustrating a thickness of first and second cover panel layers disposed in first and second areas.

FIG. 11 is a schematic cross-sectional view illustrating a thicknesses of the first and second cover panel layers 500-1 and 500-2 and the second cover panel layer 500-2 disposed in the first and second areas FA1-1 and FA1-2.

Referring to FIG. 11, a thickness W1-2 of the second cover panel layer 500-2 measured in the third direction Z of the display panel 300 may be less than a thickness W1-1 of the first cover panel layer 500-1.

As described above, in the second area FA1-2, the second cover panel layer 500-2 may not include the release film layer 530, and a step may be formed in the second area FA1-2 which is equal to a thickness of the release film layer 530 in the first area FA1-1.

Therefore, the thickness W1-2 of the second cover panel layer 500-2 measured in the third direction Z of the display panel 300 may be less than the thickness W-1 of the first cover panel layer 500-1.

In case that the thickness W1-2 of the second cover panel layer 500-2 is reduced, the thickness W-BA of the bent portion may be reduced accordingly. As a result, a radius of curvature may decrease in case that the display device 1 is bent.

In embodiments, as the radius of curvature of the bent portion decreases, the bezel area BZA may be reduced.

In an embodiment, in case that the display panel 300 is bent, the second cover panel layer 500-2 disposed in the second area FA1-2 may overlap the driving circuit IC and the flexible circuit board FPCB disposed in the second flat area FA2.

The second cover panel layer 500-2 not including the release film layer 530 may have a less thickness than the first cover panel layer 500-1 in the third direction Z of the display panel 300.

Accordingly, the thickness W-BA of the bent portion may be reduced, thereby reducing the radius of curvature of the bent portion and the bezel area BZA of the display device 1.

Figure 12:
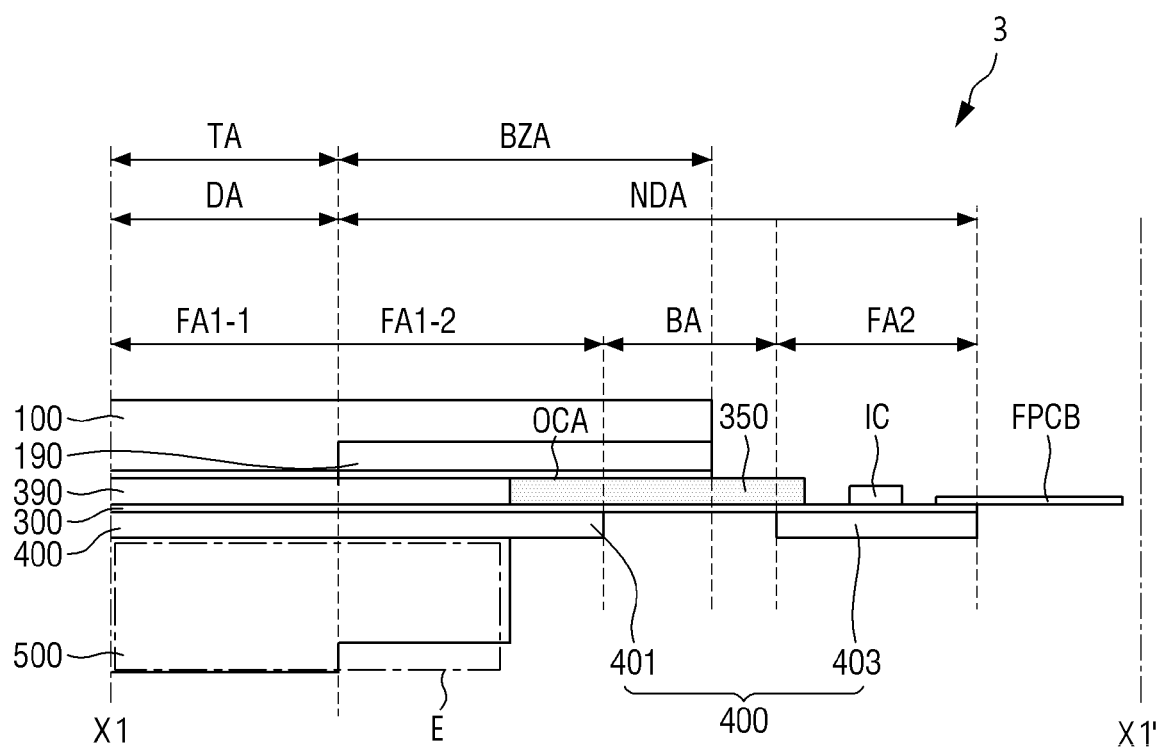
FIG. 12 is a schematic cross-sectional view of a display device in accordance with another embodiment.
Figure 13:
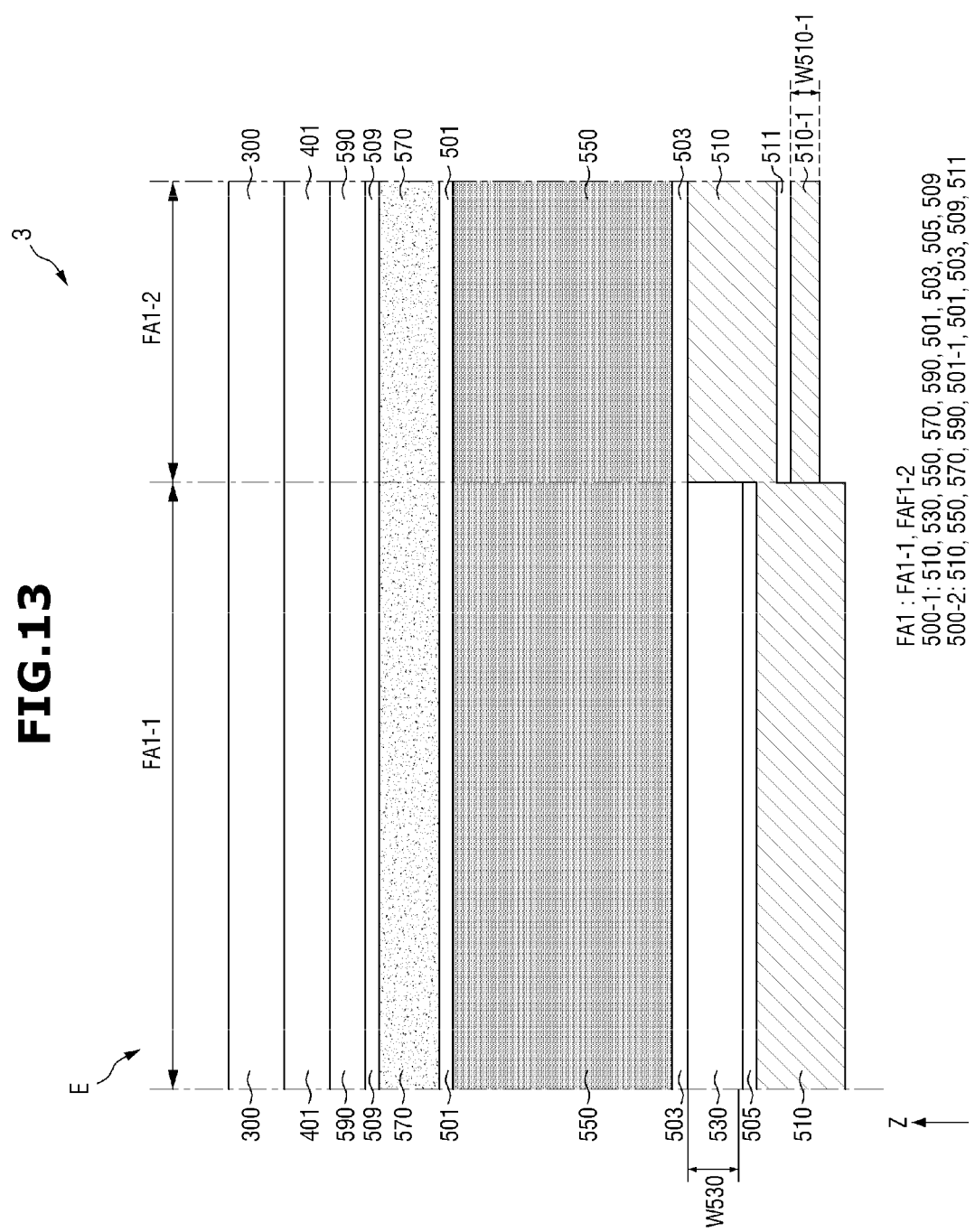
FIG. 13 is a schematic cross-sectional view of area E illustrating a stack structure of a display device in accordance with another embodiment.

FIG. 12 is a schematic cross-sectional view illustrating an arrangement of a display panel 300 and a panel bottom member of a display device 3 in accordance with another embodiment. FIG. 13 is a schematic cross-sectional view of area E illustrating a stack structure of a display device 3 in accordance with another embodiment.

Figure 15:
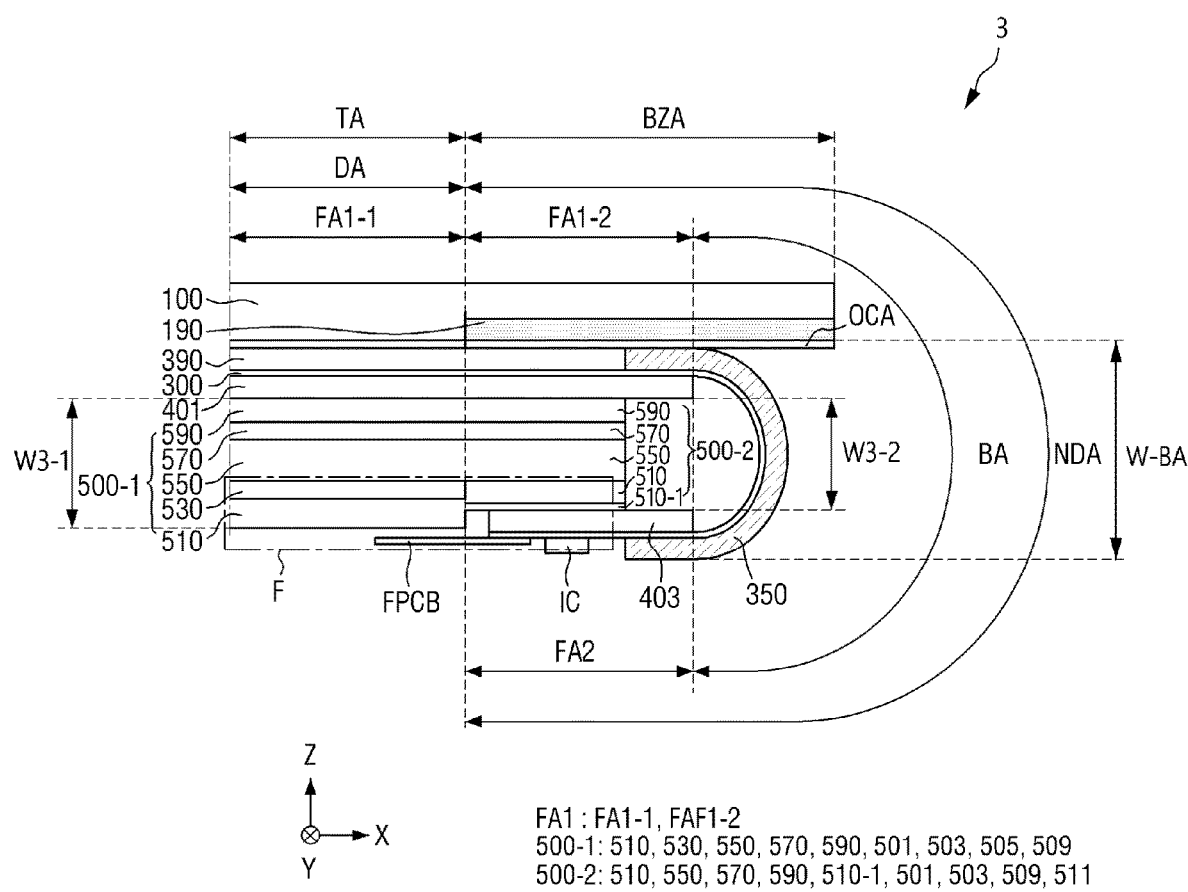
FIG. 15 is a schematic cross-sectional view of a display device in a state bent in accordance with another embodiment.

Referring to FIGS. 12, 13, and 15, a second cover panel layer 500-2 of the display device 3 may further include a second heat sink layer 510-1 in the second area FA1-2.

The first cover panel layer 500-1 of the display device 3 may include a first heat sink layer 510, a release film layer 530, a cushion layer 550, a light-blocking layer 570, and an upper coupling layer 590, and the second cover panel layer 500-2 may include a second heat sink layer 510-1 (in addition to the first heat sink layer 510, the cushion layer 550, the light-blocking layer 570, and the upper coupling layer 590).

The detailed descriptions have already been given above, and description will focus on the difference.

Referring to FIG. 13, the second heat dissipation layer 510-1 may be disposed on the first heat sink layer 510 in the second area FA1-2.

The second heat sink layer 510-1 may release heat generated inside the display device 3 to an outside and may block electromagnetic waves. In embodiments, the second heat sink layer 510-1 may include a conductive metal such as copper, silver, gold, aluminum, nickel, and a combination thereof having excellent thermal conductivity. In an embodiment, the second heat sink layer 510-1 may include copper.

The first heat sink layer 510 and the second heat sink layer 510-1 may include a same metal or different metals.

The first heat sink layer 510 and the second heat sink layer 510-1 may be attached by a fifth adhesive layer 511 disposed between the second heat sink layer 510-1 and the first heat sink layer 510.

The fifth adhesive layer 511 may include an optically clear coupling layer, a transparent resin, or the like. For example, the fifth adhesive layer 511 may include an optically clear pressure sensitive adhesive (pressure sensitive adhesive (PSA)).

Referring to FIG. 13, a thickness W530 of the release film layer 530 of the first cover panel layer 500-1 in the third direction Z may be greater than a thickness W510-1 of the second heat sink layer 510-1 of the second cover panel layer 500-2 in the third direction Z.

As described above, the second cover panel layer 500-2 may not include the release film layer 530, and a step may be formed in the second area FA1-2 which is equal to the thickness of the release film layer 530 in the first area FA1-1. Even though the second heat sink layer 510-1 is additionally included, the thickness W510-1 of the second heat sink layer 510-1 in the third direction may be less than the thickness W530 of the release film layer 530, a step may be still formed.

Figure 14:
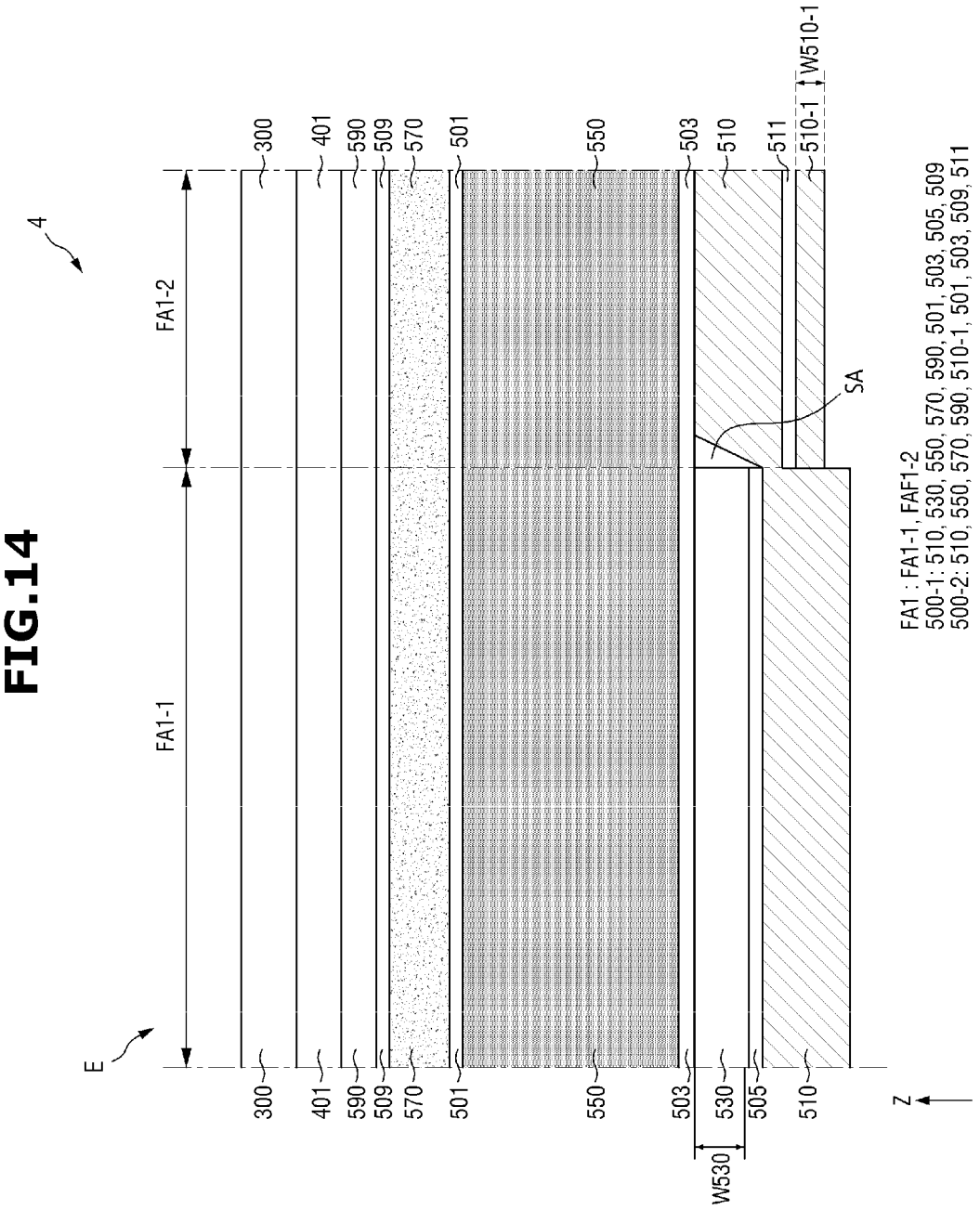
FIG. 14 is a schematic cross-sectional view of area E illustrating a stack structure of a display device in accordance with another embodiment.

FIG. 14 is a schematic cross-sectional view of area E illustrating a stack structure of a display device 4 in accordance with another embodiment.

The display device 4 of FIG. 14 and the display device 3 of FIGS. 12, 13, and 15 may be different from each other in that a second cover panel layer 500-2 of the display device 4 includes a spaced area SA between a second adhesive layer 503 and a first heat sink layer 510 in the second area FA1-2.

As described above, the second cover panel layer 500-2 may not include the release film layer 530, and there may be a step in the second area FA1-2, which is equal to a thickness of the release film layer 530 in the first area FA1-1. Accordingly, during a process of fabricating the first heat sink layer 510 in the first area FA1-1 and the second area FA1-2, there may be a spaced area SA at a side portion of the first heat sink layer 510 that meets the release film layer 530 in the second area FA1-2.

The first heat sink layer 510 may be attached to the third adhesive layer 505 disposed on the release film layer 530 in the first area FA1-1 and may be attached to the second adhesive layer 503 disposed on the cushion layer 550 in the second area FA1-2. The first heat sink layer 510 may include the spaced area SA at the side portion of the release film layer 530 while the first heat sink layer 510 is attached along the step formed.

Referring to FIG. 14, the spaced area SA may be surrounded by the release film layer 530 disposed in the first area FA1-1 and the first heat sink layer 510 and the second adhesive layer 503 disposed in the second area FA1-2.

FIG. 15 is a schematic cross-sectional view illustrating an arrangement of a display panel 300 and a panel bottom member of the display device 3 in case that the display device is bent in accordance with another embodiment.

Referring to FIG. 15, a width W3-1 of the first cover panel layer 500-1 in the third direction Z may be greater than a width W3-2 of the second cover panel 500-1 in the third direction Z.

Therefore, in case that the thickness W3-2 of the second cover panel layer 500-2 is less than the thickness W3-1 of the first cover panel layer 500-1, the thickness W-BA of the bent portion may be reduced accordingly. As a result, a radius of curvature of the bent portion may decrease.

In embodiments, as the radius of curvature of the bent portion decreases, the bezel area BZA may be reduced.

Since the second heat sink layer 510-1 is added in the display device 3, the radius of curvature of the bent portion may be reduced, and a heat sink function may be improved.

After the second flat area FA2 is bent, a pressure may be applied in the third direction Z to the flexible circuit board FPCB attached to the display panel 300 of the display device 3 in order to improve an adhesive strength of the flexible circuit board FPCB.

Accordingly, a transparent adhesive member OCA disposed between the optical film 390 and a part of the window 100 may be delaminated in the second flat area FA2. In the display device 3, by additionally disposing the second heat sink layer 510-1, it is possible to prevent a delamination of the transparent adhesive member OCA.

Figure 16:
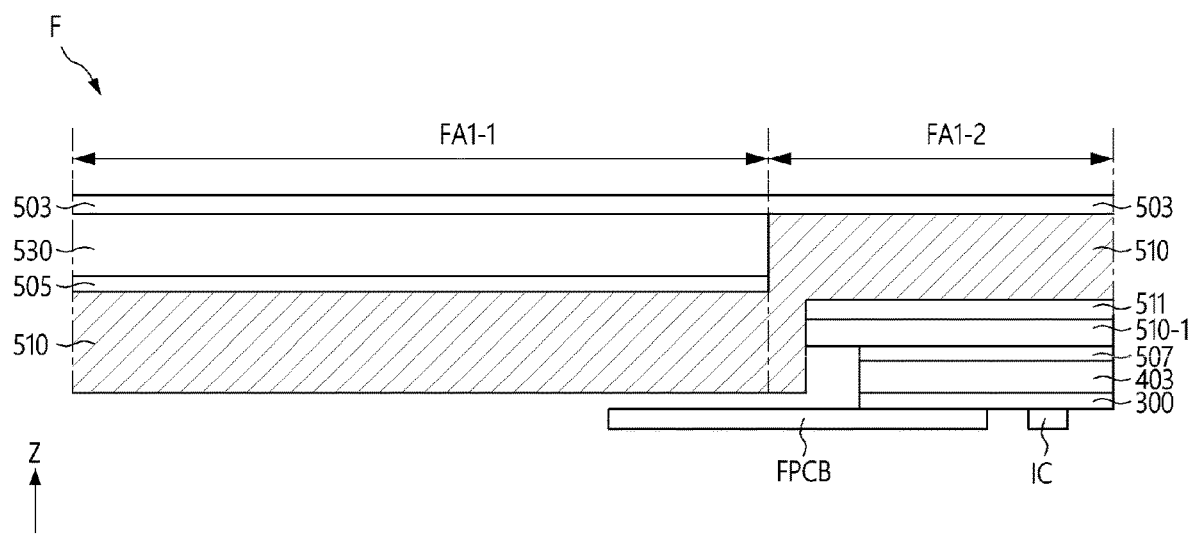
FIG. 16 is a schematic enlarged cross-sectional view of area F of FIG. 15.

FIG. 16 is a schematic enlarged cross-sectional view of area F of FIG. 15.

FIG. 16 schematically illustrates the second pattern film layer 403, the fourth adhesive layer 507, the driving circuit IC, and the flexible circuit board FPCB in the second area FA1-2 in case that the display panel 300 is bent.

Referring to FIG. 12, the display panel 300 in case that the display device 1 is not bent may include the second pattern film layer 403 and disposed on a surface of the display panel 300 and may include the driving circuit IC and the flexible circuit board FPCB disposed on an opposite surface of the display panel 300 in the second flat area FA2.

Referring to FIG. 15, in case that the display panel 300 is bent, the second pattern film layer 403, the driving circuit IC, and the flexible circuit board FPCB which are disposed in the second flat area FA2 may overlap the second area FA1-2 of the first flat area FA1 in the third direction Z. In case that the display panel 300 is bent, the second flat area FA2 may overlap the second area FA1-2 of the first flat area FA1 in the third direction Z.

As described above with reference to FIG. 16, in the second area FA1-2, the second cover panel layer 500-2 may not include the release film layer 530. Therefore, a step may be formed in the second area FA1-2 which is equal to the thickness of the release film layer 530 in the first area FA1-1.

Therefore, the second pattern film layer 403, the driving circuit IC, and the flexible printed circuit board FPCB in the second flat area FA2 may contact the step in the second area FA1-2.

In embodiments, the fourth adhesive layer 507 may be disposed on a surface of the second pattern film layer 403. The second heat sink layer 510-1 disposed in the second area FA1-2 and the second pattern film layer 403 may be attached by the fourth adhesive layer 507.

The fourth adhesive layer 507 may include an optically clear coupling layer, a transparent resin, or the like. For example, the fifth adhesive layer 511 may include an optically clear pressure sensitive adhesive (pressure sensitive adhesive (PSA)).

Referring to FIG. 16, the side portion of the first heat sink layer 510 disposed in the first area FA1-1 may be spaced apart from the second pattern film layer 403, the fourth adhesive layer 507, the driving circuit IC, and the flexible printed circuit board FPCB in the first direction X and may face the second pattern film layer 403, the fourth adhesive layer 507, the driving circuit IC, and the flexible printed circuit board FPCB in the first direction X.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a first area, a bending area, and a second area disposed between the first area and the bending area;
a display panel disposed in the first area, the bending area, and the second area; and
a cover panel layer disposed on a surface of the display panel,
wherein the cover panel layer comprises:
a light-blocking layer disposed on the surface of the display panel in the first area and the second area;
a cushion layer disposed on the light-blocking layer in the first area and the second area;
a heat sink layer disposed on the cushion layer in the first area and the second area; and
a release film layer disposed between the cushion layer and the heat sink layer in the first area but not in the second area.

2. The display device of claim 1, wherein a side of the release film layer faces the heat sink layer disposed in the second area.

3. The display device of claim 2, wherein the heat sink layer disposed in the second area and the release film layer are disposed on a same layer.

4. The display device of claim 3, wherein the release film layer comprises polyimide.

5. The display device of claim 1, further comprising:
a first adhesive layer disposed between the cushion layer and the heat sink layer in the first area and the second area, wherein
the first adhesive layer comprises a first surface facing the cushion layer and a second surface opposite to the first surface,
a portion of the second surface of the first adhesive layer disposed in the first area contacts the release film layer, and
another portion of the second surface of the first adhesive layer disposed in the second area contacts the heat sink layer.

6. The display device of claim 5, further comprising:
a second adhesive layer disposed between the heat sink layer and the release film layer in the first area,
wherein the second adhesive layer is not disposed in the second area.

7. The display device of claim 5, further comprising:
a third area disposed on a side of the bending area opposite to the second area,
a pattern film layer overlapping the second area of the display panel in a plan view and disposed between the display panel and the heat sink layer in the third area; and
a third adhesive layer disposed between the heat sink layer and the pattern film layer, and
wherein the third adhesive layer and the pattern film layer do not overlap the release film layer in a direction perpendicular to the display panel.

8. The display device of claim 7, wherein a side surface of the heat sink layer disposed in the first area is spaced apart from the pattern film layer in a first direction and faces the pattern film layer.

9. The display device of claim 7, wherein a side surface of the heat sink layer disposed in the first area is spaced apart from the third adhesive layer in a first direction and faces the third adhesive layer.

10. The display device of claim 7, further comprising:
a driving circuit and a flexible printed circuit board disposed on the third area of the display panel, wherein the driving circuit and the flexible printed circuit board overlap the pattern film layer in a direction perpendicular to the display panel.

11. The display device of claim 10, wherein the release film layer does not overlap the driving circuit in a direction perpendicular to the display panel.

12. The display device of claim 7, wherein a space is defined between a side surface of the release film layer and the heat sink layer disposed in the second area.

13. The display device of claim 12, wherein the space is surrounded by the heat sink layer, the release film layer, and the first adhesive layer.

14. The display device of claim 1, wherein a thickness of the cover panel layer disposed in the second area is less than a thickness of the cover panel layer disposed in the first area in a direction perpendicular to the display panel.

15. The display device of claim 7, further comprising:
a bending protection layer disposed on the display panel and in the bending area,
wherein the bending protection layer overlaps the pattern film layer in the direction perpendicular to the display panel.

16. A display device comprising:
a first area, a bending area, and a second area disposed between the first area and the bending area;
a display panel disposed in the first area, the bending area, and the second area; and
a cover panel layer disposed on a surface of the display panel,
wherein the cover panel layer comprises:
a light-blocking layer disposed on the surface of the display panel in the first area and the second area;
a cushion layer disposed on the light-blocking layer in the first area and the second area;
a first heat sink layer disposed on the cushion layer in the first area and the second area;
a release film layer disposed between the cushion layer and the first heat sink layer in the first area but not in the second area; and
a second heat sink layer disposed on the first heat sink layer in the second area but not in the first area.

17. The display device of claim 16, wherein
a side of the release film layer faces the first heat sink layer disposed in the second area, and
a side of the first heat sink layer disposed in the first area faces the second heat sink layer disposed in the second area.

18. The display device of claim 16, further comprising:
a first adhesive layer disposed between the first heat sink layer and the second heat sink layer in the second area,
wherein a side of the first heat sink layer disposed in the first area faces the first adhesive layer.

19. The display device of claim 18, wherein a thickness of the second heat sink layer is less than a thickness of the release film layer in a direction perpendicular to the display panel.

20. The display device of claim 19, wherein a thickness of the cover panel layer disposed in the second area is less than a thickness of the cover panel layer disposed in the first area in the direction perpendicular to the display panel.

* * * * *